(12) United States Patent
Watanabe

(10) Patent No.: US 10,317,067 B2
(45) Date of Patent: *Jun. 11, 2019

(54) HEAT RADIATING APPARATUS AND LIGHT ILLUMINATING APPARATUS WITH THE SAME

(71) Applicant: HOYA CANDEO OPTRONICS CORPORATION, Toda-shi, Saitama (JP)

(72) Inventor: Hiroaki Watanabe, Toda (JP)

(73) Assignee: HOYA CANDEO OPTRONICS CORPORATION, Toda-shi, Saitama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/474,616

(22) Filed: Mar. 30, 2017

(65) Prior Publication Data

US 2017/0284650 A1 Oct. 5, 2017

(30) Foreign Application Priority Data

Mar. 31, 2016 (JP) ................................. 2016-073750
Feb. 14, 2017 (JP) ................................. 2017-025338

(51) Int. Cl.
*B05D 3/06* (2006.01)
*F28F 3/02* (2006.01)
(Continued)

(52) U.S. Cl.
CPC ............ *F21V 29/713* (2015.01); *B05D 3/067* (2013.01); *B41F 23/0409* (2013.01);
(Continued)

(58) Field of Classification Search
CPC ....... F21V 29/713; B05D 3/067; F28D 15/02; H01L 23/427; H01L 25/0753;
(Continued)

(56) References Cited

U.S. PATENT DOCUMENTS 8,330,337 B2 * 12/2012 Yu .................. F21V 29/004
165/104.26
2004/0135159 A1 * 7/2004 Siegel ............... B41F 23/0409
257/88

(Continued)

FOREIGN PATENT DOCUMENTS

JP 2014-038866 A 2/2014
JP 2015-153771 A 8/2015
(Continued)

*Primary Examiner* — Wyatt A Stoffa
*Assistant Examiner* — Hanway Chang
(74) *Attorney, Agent, or Firm* — Rabin & Berdo, P.C.

(57) ABSTRACT

Provided is a heat radiating apparatus for radiating heat of a heat source in air. The heat radiating apparatus includes a support member in close contact with the heat source on a first principal surface side, a heat pipe supported by the support member, and a plurality of heat radiating fins in a space that faces a second principal surface to radiate the heat transferred by the heat pipe. The heat pipe has a first line part thermally joined with the support member, a second line part thermally joined with the heat radiating fins, and a connecting part. A plurality of heat radiating apparatuses can be connected such that the first principal surfaces are successive, and each of the plurality of heat radiating apparatuses has a receiving part for receiving the connecting parts of adjacent heat radiating apparatuses in the space that faces the second principal surface.

24 Claims, 41 Drawing Sheets

(51) Int. Cl.
  H05K 7/20    (2006.01)
  B41F 23/04   (2006.01)
  F21V 29/71   (2015.01)
  F28D 15/02   (2006.01)
  F21Y 115/10  (2016.01)
  H01L 23/427  (2006.01)
  H01L 25/075  (2006.01)
(52) U.S. Cl.
  CPC .......... *B41F 23/0453* (2013.01); *F28D 15/02* (2013.01); *F28D 15/0275* (2013.01); *F28F 3/02* (2013.01); *H01L 23/427* (2013.01); *H01L 25/0753* (2013.01); *H05K 7/20172* (2013.01); *H05K 7/20418* (2013.01); *H05K 7/20445* (2013.01); *F21Y 2115/10* (2016.08)
(58) Field of Classification Search
  CPC ........... H05K 7/20172; H05K 7/20418; H05K 7/20445; F21Y 2115/10
  USPC ...................................................... 250/492.1
  See application file for complete search history.

(56) References Cited

U.S. PATENT DOCUMENTS

| | | | |
|---|---|---|---|
| 2005/0092465 A1* | 5/2005 | Lin | .................... F28D 15/0275 165/104.21 |
| 2009/0147510 A1 | 6/2009 | Peng | |
| 2012/0098401 A1 | 4/2012 | Yu et al. | |
| 2013/0314914 A1 | 11/2013 | Kim et al. | |
| 2017/0284738 A1* | 10/2017 | Watanabe | ................ F26B 3/28 |

FOREIGN PATENT DOCUMENTS

| KR | 2016-0008112 A | 1/2016 |
|---|---|---|
| WO | WO 2012-113705 A2 | 8/2012 |
| WO | WO 2012-113705 A3 | 10/2012 |

* cited by examiner

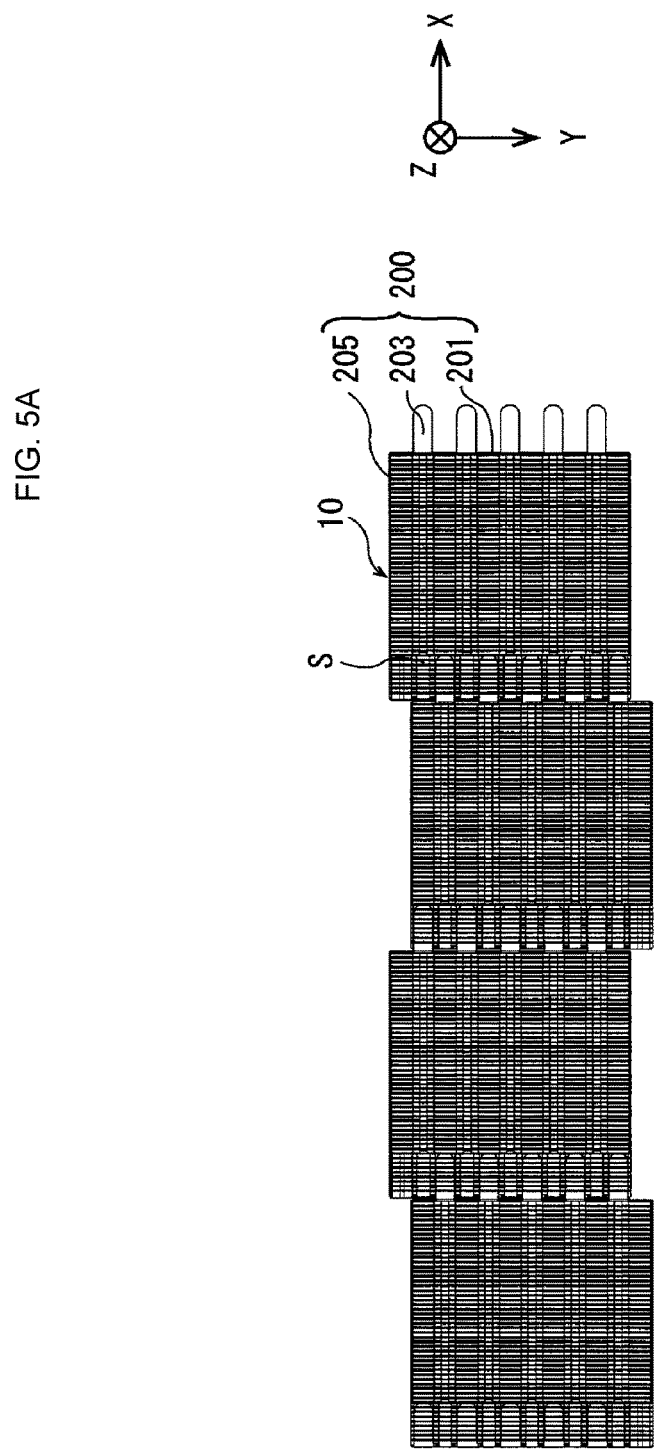

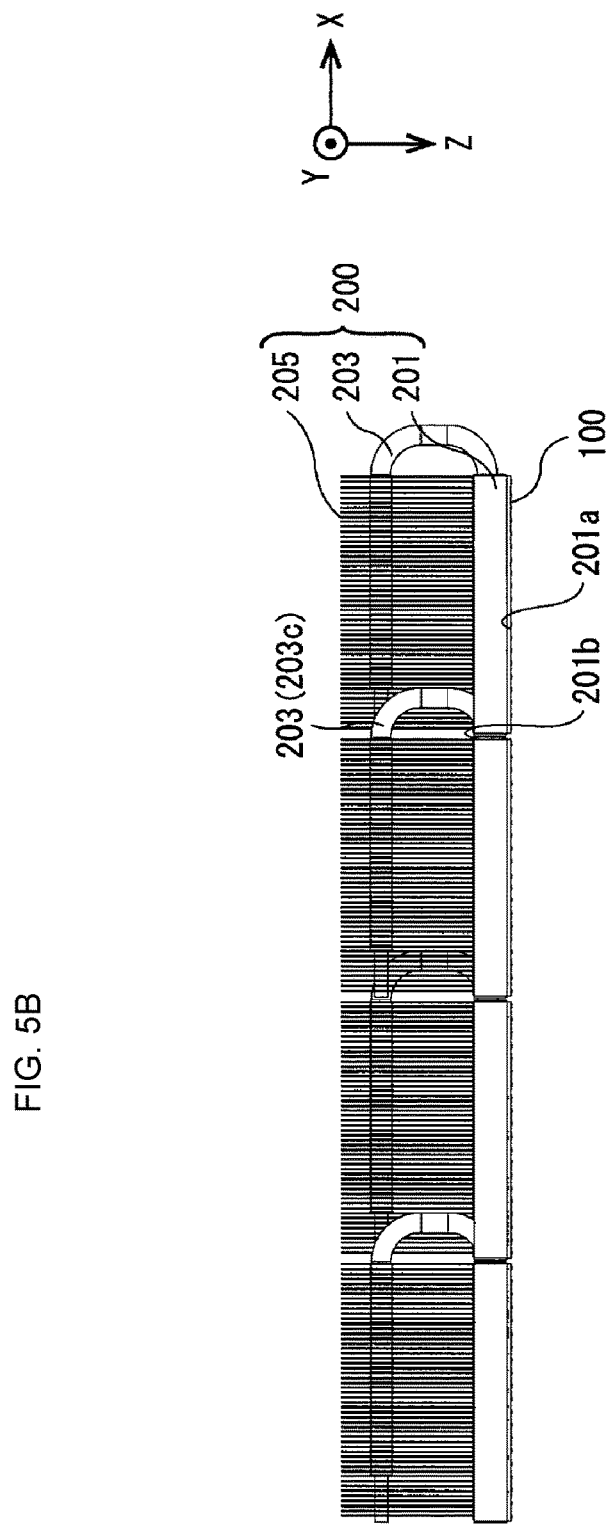

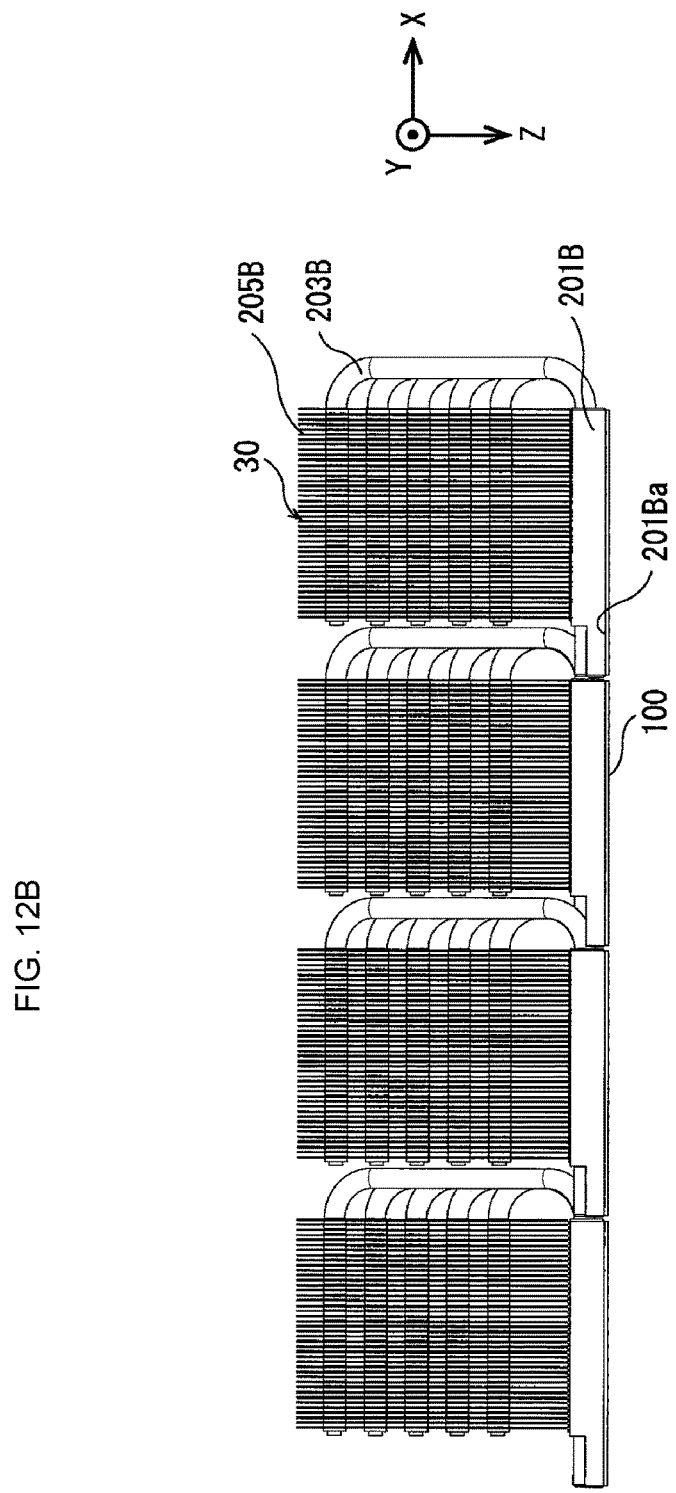

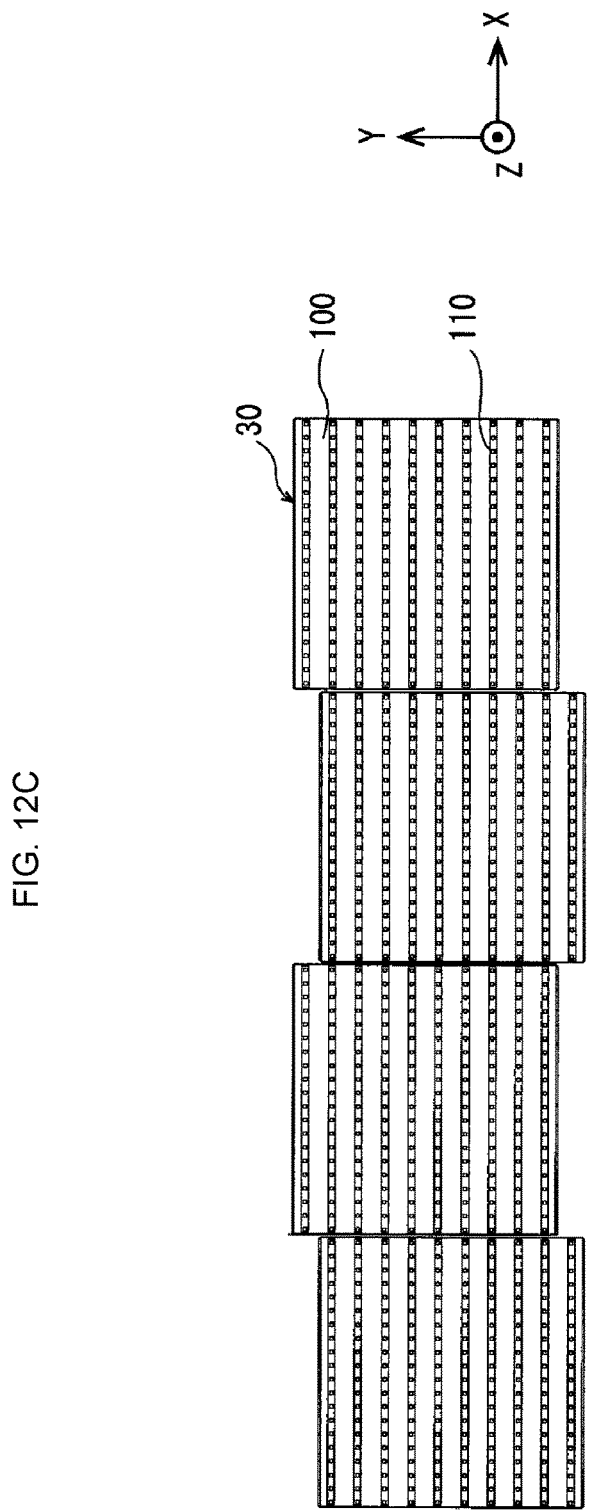

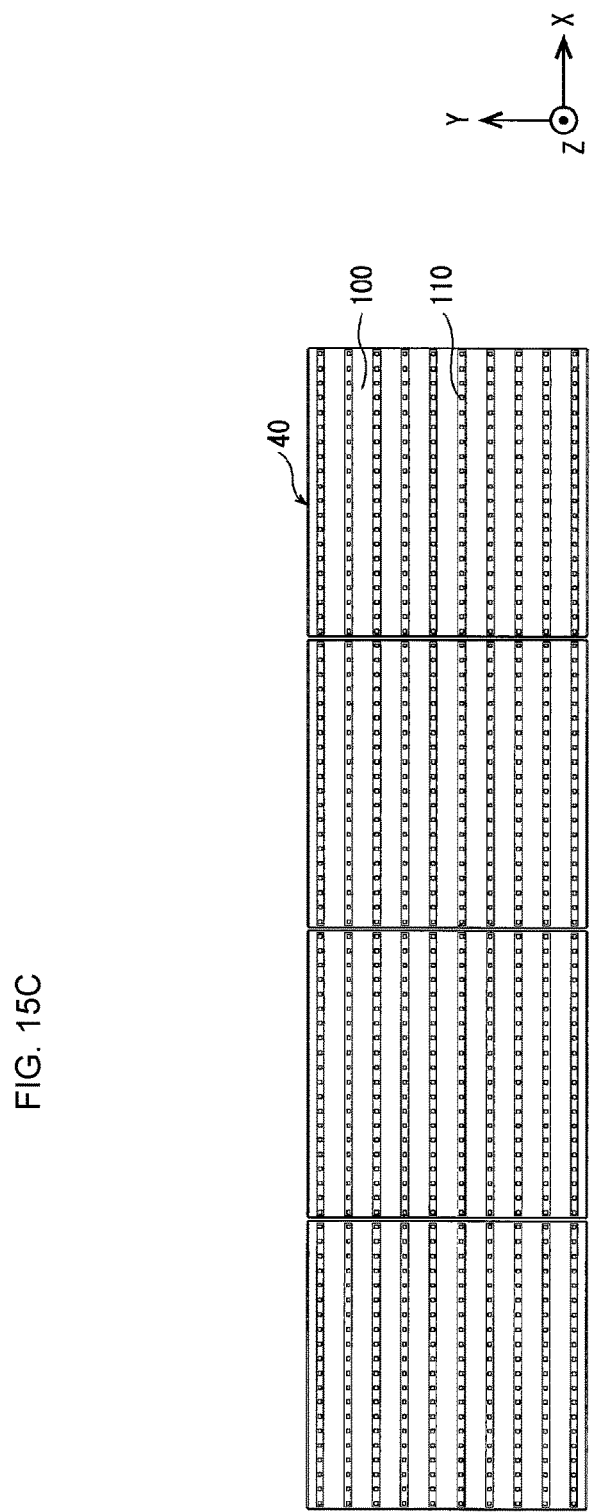

HEAT RADIATING APPARATUS AND LIGHT ILLUMINATING APPARATUS WITH THE SAME

TECHNICAL FIELD

The present disclosure relates to a heat radiating apparatus for cooling a light source of a light illuminating apparatus, and more particularly, to a heat pipe-type heat radiating apparatus with heat pipe that is inserted into and passes through a plurality of heat radiating fins, and a light illuminating apparatus with the heat radiating apparatus.

BACKGROUND ART

Conventionally, an ultraviolet (UV) curable ink that is cured by radiation of UV light is used as an ink for sheet-fed offset printing. Furthermore, a UV curable resin is used as an adhesive around Flat Panel Display (FPD) such as a liquid crystal panel or an organic Electro Luminescence (EL) panel. To cure the UV curable ink or UV curable resin, generally, a UV light illuminating apparatus that irradiates UV light is used.

As the UV light illuminating apparatus, a lamp-type illuminating apparatus using a high pressure mercury lamp or a mercury xenon lamp as a light source has been long known, but recently, in keeping with the demand for reduced power consumption, a longer service life, and a compact device, a UV light illuminating apparatus using Light Emitting Diode (LED) as an alternative to a traditional discharge lamp for a light source is developed.

The UV light illuminating apparatus using LED as a light source is disclosed by, for example, Patent Literature 1. The UV light illuminating apparatus disclosed by Patent Literature 1 is equipped with a plurality of light illuminating modules, each having a light illuminating device on which a plurality of light emitting devices (LEDs) is mounted. The plurality of light illuminating modules is lined up in a row, and is configured to irradiate UV light of a line shape to a predetermined area of an object to be illuminated placed facing the plurality of light illuminating modules.

If LED is used as a light source as described above, a majority of power inputted is converted to heat, resulting in lower light emitting efficiency and a shorter service life caused by heat generated from the LED itself, so coping with the heat is at an issue. Thus, the UV light illuminating apparatus disclosed by Patent Literature 1 employs the design for forced radiation of heat generated from the LED by placing a member for heat radiation on the surface opposite to each light illuminating device.

The member for heat radiation disclosed by Patent Literature 1 is based on so-called air cooling involving cooling down by a flow of coolant, but because pipe installation for coolant is needed, the device itself increases in size or there is a need to prevent leaks. Accordingly, air cooling-based heat radiation with high efficiency using heat pipe is proposed (for example, Patent Literature 2).

A light illuminating apparatus disclosed by Patent Literature 2 has heat pipe and a plurality of heat radiating fins that is inserted into and connected to the heat pipe, on the surface side opposite to a light emitting module having a plurality of light emitting devices (LEDs) mounted thereon, and employs the design for transferring heat generated from the LEDs through the heat pipe and radiating the heat in air from the heat radiating fins.

RELATED LITERATURES

Patent Literatures (Patent Literature 1) Japanese Patent Publication No. 2015-153771

(Patent Literature 2) Japanese Patent Publication No. 2014-038866

DISCLOSURE

Technical Problem (Summary of the Invention)
(Problem to be Solved by the Invention)

According to the heat radiating apparatus of the light illuminating apparatus disclosed by Patent Literature 2, because heat generated from the light emitting diodes (LEDs) is rapidly transferred by the heat pipe and is radiated from the plurality of heat radiating fins, the LEDs are efficiently cooled. Thereby, the performance degradation or damage of the LEDs is prevented, and high-brightness light emission is achieved. Furthermore, because the heat radiating apparatus disclosed by Patent Literature 2 is configured to transfer heat in a direction opposite to the emission direction of the LEDs by bending the heat pipe in the shape of ⊐, the light illuminating apparatus can be reduced in size in a direction perpendicular to the emission direction of the LEDs.

However, in case that the heat pipe is bent in the shape of ⊐ like the heat radiating apparatus of Patent Literature 2, the curved part of the heat pipe gets lifted up from the base plate (support member) of the light emitting module and the cooling capacity of the corresponding lifted part significantly reduces, and to fully cool the entire base plate, the line part of the heat pipe needs to be placed in close contact over the entire surface opposite to the base plate, causing the problem that the curved part of the heat pipe protrudes out of the outside of the base plate (i.e., beyond the exterior of the light emitting module). Furthermore, if the curved part of the heat pipe protrudes out of the outside of the base plate, it is impossible to closely place in an arrangement direction of the LEDs (i.e., a direction in which the line part of the heat pipe extends), making it impossible to connect and place the light illuminating devices in a line shape, similar to the design disclosed by Patent Literature 1.

In view of these circumstances, the present disclosure is directed to providing a heat radiating apparatus that fully cools the entire base plate (support member) using heat pipe and allows for connection and arrangement in a line shape, and is further directed to providing a light illuminating apparatus with the heat radiating apparatus.

Technical Solution

To achieve the object, a heat radiating apparatus of the present disclosure is a heat radiating apparatus which is placed in close contact with a heat source to radiate heat of the heat source in air, and includes a support member which has a shape of a plate and is placed in close contact with the heat source on a first principal surface side, a heat pipe which is supported by the support member and is thermally joined with the support member to transfer the heat from the heat source, and a plurality of heat radiating fins which is placed in a space that faces a second principal surface opposite to the first principal surface and is thermally joined with the heat pipe to radiate the heat transferred by the heat pipe, wherein the heat pipe has a first line part which is thermally joined with the support member, a second line part which is thermally joined with the plurality of heat radiating fins, and a connecting part which connects one end part of the first line part to one end part of the second line part such that the first line part and the second line part are successive and protrudes from the support member in a direction in which the first line part extends, a plurality of heat radiating apparatuses can be connected such that the first principal surfaces are successive, and when the plurality of heat radiating apparatuses are connected in the direction in which the first line part extends, each of the plurality of heat radiating apparatuses has a receiving part for receiving the connecting parts of adjacent heat radiating apparatuses in the space that faces the second principal surface.

By this construction, in the direction in which the first line part extends, a cooling capacity difference is small, and thus the substrate can be equally (approximately uniformly) cooled, and light emitting diode (LED) devices placed on the substrate are approximately uniformly cooled as well. Accordingly, as a temperature difference between each LED device is small, an irradiation intensity difference resulting from the temperature characteristics is also small. Furthermore, because of having the receiving part for receiving the connecting part protruding in the direction in which the first line part extends, a plurality of heat radiating apparatuses can be connected even in the direction in which the first line part extends.

Furthermore, preferably, the heat pipe is provided in multiple numbers, and the first line parts of the plurality of heat pipes are placed at a first preset interval in a direction approximately orthogonal to the direction in which the first line parts extend.

Furthermore, preferably, the second line parts of the plurality of heat pipes are approximately parallel to the second principal surface, and are placed at the first preset interval in the direction approximately orthogonal to the direction in which the first line parts extend.

Furthermore, preferably, the receiving part is formed between each heat pipe on a side opposite to a side from which the connecting part protrudes.

Furthermore, preferably, the receiving part is formed between each heat pipe on a same side as a side from which the connecting part protrudes.

Furthermore, preferably, a fan is provided in the space that faces the second principal surface to generate an air current in a direction approximately perpendicular to the second principal surface.

Furthermore, locations of the second line parts of each heat pipe may differ in a direction approximately perpendicular to and a direction approximately parallel to the second principal surface, when viewed in the direction in which the first line parts extend. Furthermore, in this case, it is preferred to include a fan which is placed in the space that faces the second principal surface to generate an air current in a direction approximately parallel to the second principal surface.

Furthermore, preferably, the first line part is inclined with respect to the second principal surface, the connecting part protrudes in a direction facing away from the second principal surface, and the receiving part is formed on a side opposite to the side from which the connecting part protrudes. Furthermore, in this case, preferably, the second line parts of the plurality of heat pipes are arranged at a second preset interval that is longer than the first preset interval in the direction approximately orthogonal to the direction in which the first line parts extend.

Furthermore, the support member may have at least one set of approximately parallel sides, and the first line part may extend along the sides of the support member.

Furthermore, the support member may have at least one set of approximately parallel sides, and the first line part may extend at a preset angle of inclination with respect to the sides of the support member. Furthermore, in this case, preferably, the receiving part is formed on a side opposite to a side from which the connecting part protrudes. Furthermore, it is preferred to include a fan which is placed in the space that faces the second principal surface to generate an air current in a direction approximately perpendicular to the second principal surface.

Furthermore, preferably, the second line part is approximately parallel to the second principal surface.

Furthermore, preferably, the support member has a groove part of a shape conforming to the first line part on the second principal surface side, and the first line part is placed to be inserted into the groove part.

Furthermore, preferably, the support member has a groove part of a shape conforming to the first line part on the first principal surface side, and the first line part is placed to be inserted into the groove part.

Further, in another aspect, a light illuminating apparatus of the present disclosure includes any one heat radiating apparatus described above, a substrate placed in close contact with the first principal surface, and a plurality of LED devices placed approximately parallel to the first line part of the heat pipe on a surface of the substrate.

Furthermore, preferably, the plurality of LED devices is placed at a predetermined pitch in a direction in which the first line part extends, and a distance from the other end of the first line part to one end of the support member in the direction in which the first line part extends is ½ or less of the pitch.

Furthermore, preferably, the plurality of LED devices is placed in multiple rows in a direction approximately orthogonal to the direction in which the first line part extends.

Furthermore, preferably, the plurality of LED devices is placed at a location opposite to the first line part with the substrate interposed between.

Furthermore, preferably, the light illuminating apparatus includes the plurality of heat radiating apparatuses connected such that the first principal surfaces are successive. Furthermore, in this case, preferably, the plurality of heat radiating apparatuses is arranged and connected in the direction in which the first line part extends.

Furthermore, preferably, the LED device emits light of a wavelength that acts on an ultraviolet curable resin.

Advantageous Effects

As described above, according to the present disclosure, it is possible to realize a heat radiating apparatus that fully cools the entire base plate (support member) using the heat pipe and allows for connection and arrangement in a line shape, and a light illuminating apparatus with the corresponding heat radiating apparatus.

DESCRIPTION OF DRAWINGS

FIGS. 5A, 5B, and 5C are diagrams showing that light illuminating apparatuses with heat radiating apparatuses according to a first embodiment of the present disclosure are connected in X-axis direction.

FIGS. 12A, 12B and 12C are diagrams showing that heat radiating apparatuses according to a third embodiment of the present disclosure are connected.

FIGS. 15A, 15B and 15C are diagrams showing that heat radiating apparatuses according to a fourth embodiment of the present disclosure are connected.

Figure 1A:
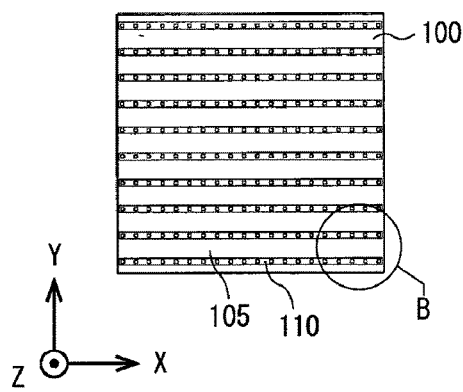
FIGS. 1A, 1B, 1C and 1D are diagrams of outward appearance schematically illustrating the construction of a light illuminating apparatus with a heat radiating apparatus according to a first embodiment of the present disclosure.
Figure 1B:
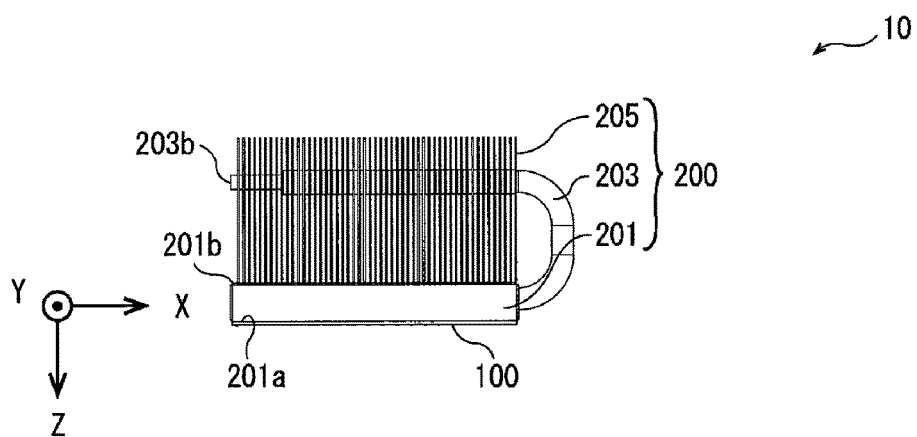

DETAILED DESCRIPTION OF MAIN ELEMENTS 10, 10M, 20, 20M, 30, 30M, 40, 40M, 50, 50M, 60, 60M, 70: Light illuminating apparatus
100: LED unit
105: Substrate
110: LED device
200, 200M, 200A, 200AM, 200B, 200BM, 200C, 200CM, 200D, 200DM, 200E, 200EM, 200F: Heat radiating apparatus
201, 201A, 201B, 201C, 201D, 201E, 201F: Support member
201A, 201Aa, 201Ba, 201Ca, 201Da, 201Ea, 201Fa: First principal surface
201$b$, 201Ab, 201Bb, 201Cb, 201Db, 201Eb: Second principal surface
201$c$, 201Fc: Groove part
201$d$, 201Ad, 201Bd, 201Cd, 201Dd, 201Ed: Groove part
203, 203A, 203B, 203C, 203D, 203E, 203F: Heat pipe
203A, 203Aa, 203Ba, 203Ca, 203Da, 203Ea, 203Fa: First line part
203$b$, 203Ab, 203Bb, 203Cb, 203Db, 203Eb: Second line part
203$c$, 203Ac, 203Bc, 203Cc, 203Dc, 203Ec, 203Fc: Connecting part
203$ca$, 203$cb$, 203Bca, 203Cca: Curved part
205, 205A, 205B, 205C, 205D, 205E, 205F: Heat radiating fin
205A: Through-hole
205$c$, 205Ac, 205Fc: Cutout
210, 210A, 210B, 210O, 210D, 210E, 210F: Cooling fan

[Best Mode]

(Mode for Carrying Out the Invention)

Hereinafter, the embodiments of the present disclosure will be described in detail with reference to the accompanying drawings. Furthermore, in the drawings, the same or equivalent elements are assigned with the same reference numerals, and its description is not repeated herein.

(First Embodiment)

FIG. 1 is a diagram of outward appearance schematically illustrating the construction of a light illuminating apparatus 10 with a heat radiating apparatus 200 according to a first embodiment of the present disclosure. Furthermore, FIG. 2 is a perspective view of the light illuminating apparatus 10. The light illuminating apparatus 10 of this embodiment is an apparatus that is mounted in a light source apparatus for curing an ultraviolet (UV) curable ink used as an ink for sheet-fed offset printing or a UV curable resin used as an adhesive in Flat Panel Display (FPD), and is placed facing an object to be illuminated to emit UV light to a predetermined area of the object to be illuminated. As used herein, a direction in which first line parts 203a of heat pipes 203 of the heat radiating apparatus 200 extend is defined as X-axis direction, a direction in which the first line parts 203a of the heat pipes 203 are arranged is defined as Y-axis direction, and a direction orthogonal to X axis and Y axis is defined as Z-axis direction. Furthermore, because the required irradiation area differs according to the use or specification of the light source apparatus in which the light illuminating apparatus 10 is mounted, the light illuminating apparatus 10 of this embodiment is configured to allow for connection in X-axis direction and Y-axis direction (as described in detail below).

(Construction of the Light Illuminating Apparatus 10)

As shown in FIG. 1, the light illuminating apparatus 10 of this embodiment includes a light emitting diode (LED) unit 100 and the heat radiating apparatus 200. Furthermore, FIG. 1A is a front view (a diagram when viewed from the Z-axis direction downstream side (positive direction side)) of the light illuminating apparatus 10 of this embodiment, FIG. 1B is a plane view (a diagram when viewed from the Y-axis direction downstream side (positive direction side)), FIG. 1C is a right side view (a diagram when viewed from the X-axis direction downstream side (positive direction side)), FIG. 1D is a left side view (a diagram when viewed from the X-axis direction upstream side (negative direction side)).

(Construction of the LED Unit 100)

Figure 3:
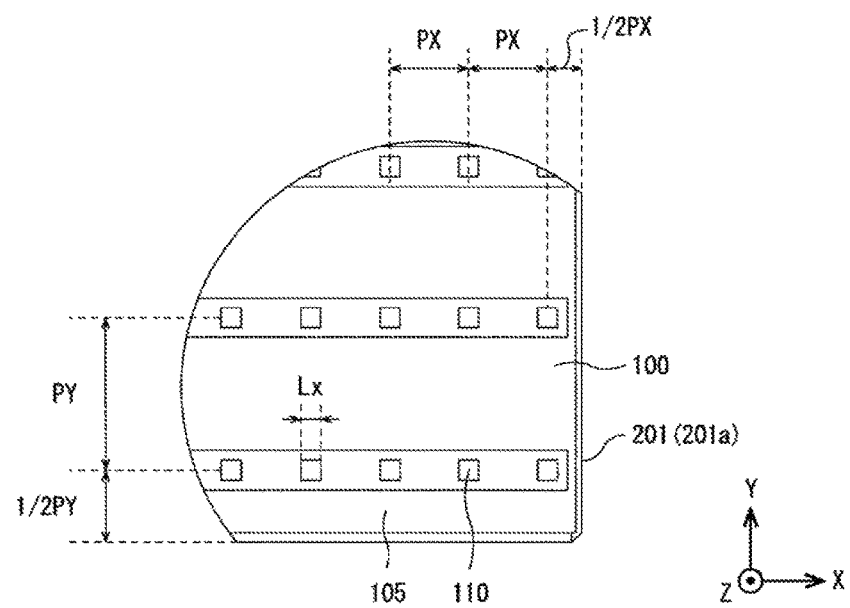
FIG. 3 is a diagram illustrating the construction of a light emitting diode (LED) unit provided in a light illuminating apparatus with a heat radiating apparatus according to a first embodiment of the present disclosure.

FIG. 3 is a diagram illustrating the construction of the LED unit 100 of this embodiment, and is an enlarged view of section B in FIG. 1. As shown in FIGS. 1A and 3, the LED unit 100 is equipped with a substrate 105 of a rectangular plate shape approximately parallel to X-axis direction and Y-axis direction, and a plurality of LED devices 110 placed on the substrate 105.

Figure 2:
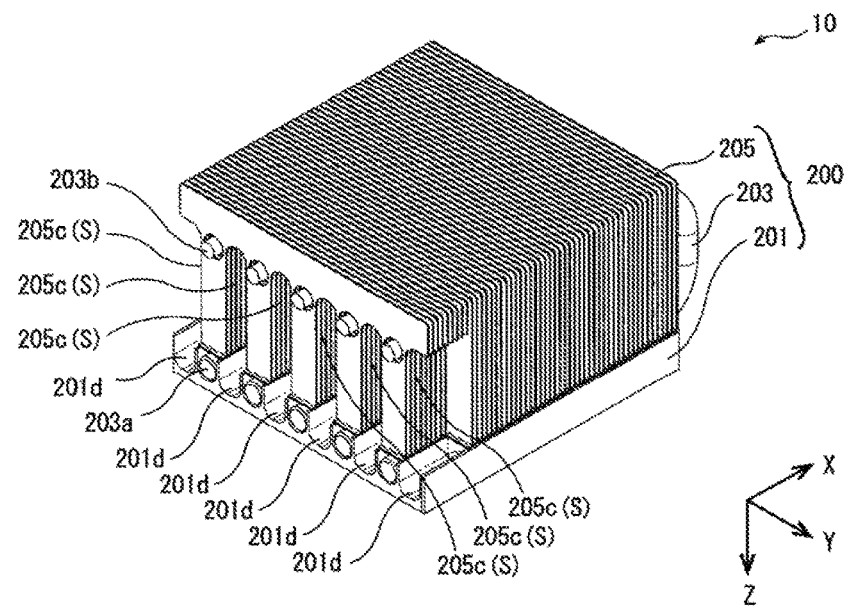
FIG. 2 is a perspective view schematically illustrating the construction of a light illuminating apparatus with a heat radiating apparatus according to a first embodiment of the present disclosure.

The substrate 105 is a rectangular shaped wiring substrate formed of a material having high thermal conductivity (for example, copper, aluminum, and aluminum nitride), and as shown in FIG. 1A, the substrate 105 has 200 LED devices 110 mounted on the surface in 20 columns (X-axis direction)×10 rows (Y-axis direction) arrangement at a predetermined interval in X-axis direction and Y-axis direction by Chip On Board (COB) technology. An anode pattern (not shown) and a cathode pattern (not shown) for supplying power to each LED device 110 are formed on the substrate 105, and each LED device 110 is electrically connected to the anode pattern and the cathode pattern, respectively. Furthermore, the substrate 105 is electrically connected to a LED driving circuit (not shown) with a wiring cable not shown, and each LED device 110 is supplied with a drive current from the LED driving circuit through the anode pattern and the cathode pattern.

The LED device 110 is a semiconductor device that is supplied with the drive current from the LED driving circuit to emit UV light (for example, 365 nm, 385 nm, 395 nm, 405 nm wavelength). In this embodiment, 20 LED devices 110 are arranged at a predetermined column pitch PX in X-axis direction, and with 20 LED devices in each row, 10 rows of LED devices 110 are arranged at a predetermined row pitch PY in Y-axis direction (FIG. 3). Accordingly, when the drive current is supplied to each LED device 110, UV light in the shape of 10 lines approximately parallel to X-axis direction is emitted from the LED unit 100. Furthermore, each LED device 110 of this embodiment is supplied to the drive current adjusted to emit an approximately equal amount of UV light, and UV light emitted from the LED unit 100 has approximately uniform light quantity distribution in X-axis direction and Y-axis direction. Furthermore, the light illuminating apparatus 10 of this embodiment is configured to allow for connection in X-axis direction and Y-axis direction to change an irradiation area, and for successive arrangement of the LED devices 110 between adjacent light illuminating apparatuses 10 when connected, the LED devices 110 disposed at the two end parts in X-axis direction are placed at the position of ½PX from the edge of the support member 201 of the heat radiating apparatus 200, and the LED devices 110 disposed at the two end parts in Y-axis direction are placed at the position of ½PY from the edge of the support member 201 of the heat radiating apparatus 200 (FIG. 3).

(Construction of the Heat Radiating Apparatus 200)

Figure 1C:
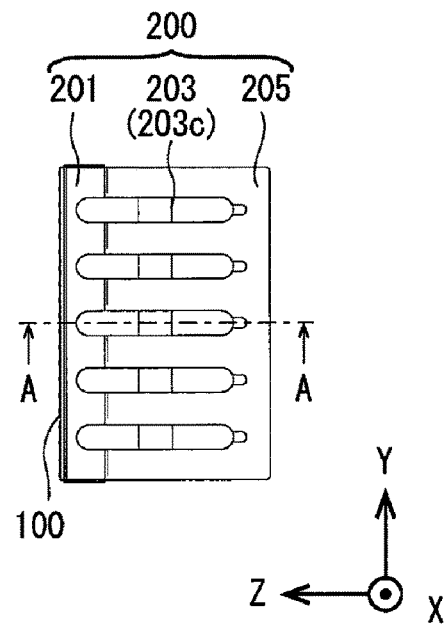
Figure 4A:
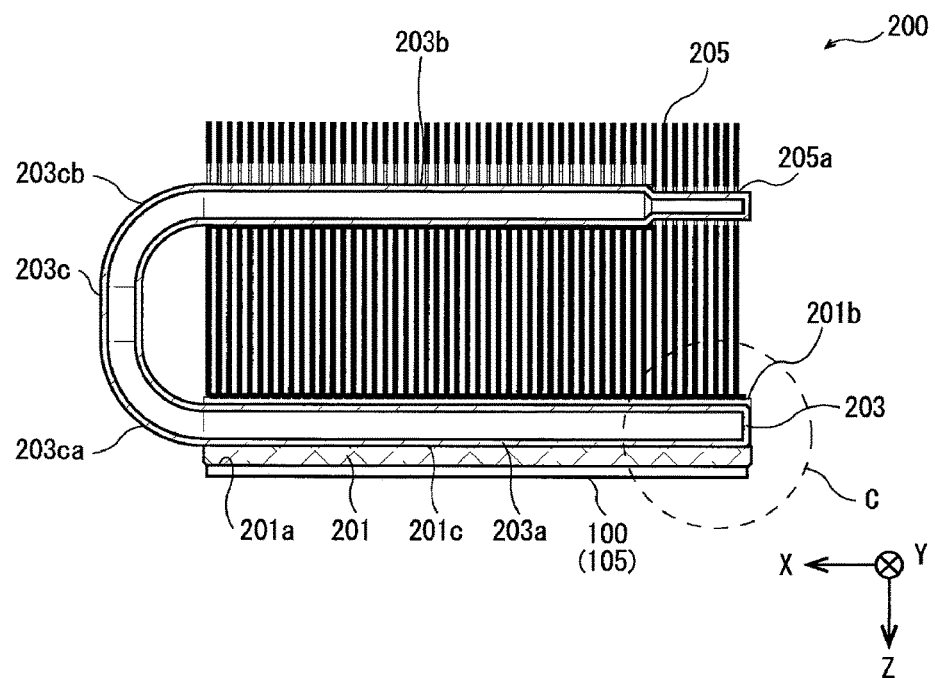
FIGS. 4A and 4B are diagrams illustrating the construction of a heat radiating apparatus according to a first embodiment of the present disclosure.
Figure 4B:
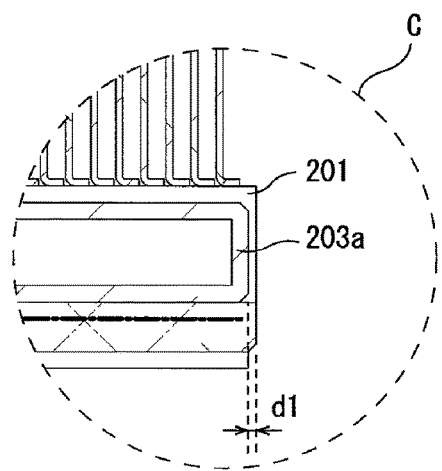

FIG. 4 is a diagram illustrating the construction of the heat radiating apparatus 200 of this embodiment. FIG. 4A is a cross-sectional view taken along the line A-A in FIG. 1C, and FIG. 4B is an enlarged view of section B in FIG. 4A. The heat radiating apparatus 200 is an apparatus that is placed in close contact with the surface opposite to the substrate 105 (a surface on the opposite side to the surface on which the LED device (FIG. 1A) is mounted) to radiate heat generated from each LED device 110, and includes a support member 201, a plurality of heat pipes 203, and a plurality of heat radiating fins 205. When the drive current flows into each LED device 110 (FIG. 3) and UV light is emitted from each LED device 110, the temperature increases by self-heat generation of the LED device 110, causing a significant reduction in light emitting efficiency. For this reason, in this embodiment, the heat radiating apparatus 200 is installed in close contact with the surface opposite to the substrate 105, and the heat generated from the LED device 110 is forcibly radiated by conduction toward the heat radiating apparatus 200 through the substrate 105.

Figure 1D:
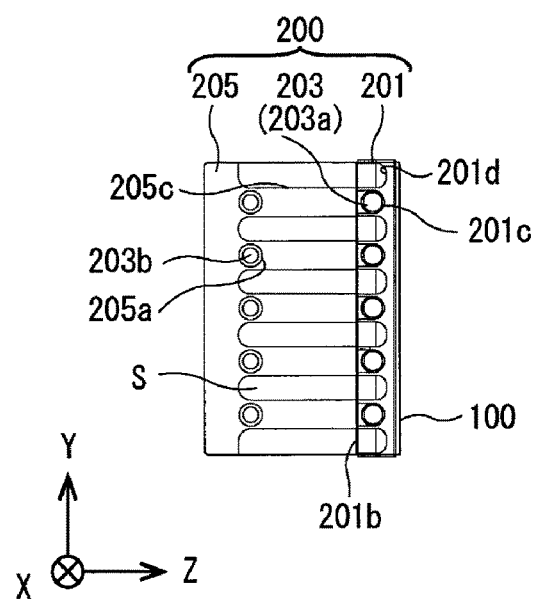

The support member 201 is a member of a rectangular plate shape formed of metal having high thermal conductivity (for example, copper and aluminum). The support member 201 has a first principal surface 201a attached tightly to the surface opposite to the substrate 105 through a heat conducting member such as grease, to receive heat generated from the LED unit 100 serving as a heat source. On a second principal surface 201b (a surface opposite to the first principal surface 201a) of the support member 201 of this embodiment, a groove part 201c is formed along X-axis direction to conform to the shape of a first line part 203a of a heat pipe 203 as described below (FIG. 1D, FIG. 4) to support the heat pipe 203 by the support member 201. As described above, the support member 201 of this embodiment is configured to support the heat pipe 203 as well as to act as a heat receiving part to receive heat from the LED unit 100. Furthermore, as shown in FIGS. 1D and 2, when the light illustrating apparatuses 10 are connected in Y-axis direction, a groove part 201d for receiving a curved part 203ca of a heat pipe 203 of adjacent light illustrating apparatus 10 (FIG. 4) is formed on the two sides of Y-axis direction of each groove part 201c.

The heat pipe 203 is a hermetically closed pipe of metal (for example, metal such as copper, aluminum, iron and magnesium, or alloys thereof) having a hollow of an approximately circular shape in cross section, in which a working fluid (for example, water, alcohol, and ammonia) is filled under reduced pressure. As shown in FIG. 4, each heat pipe 203 of this embodiment has an approximately inverted ⊐ shape when viewed in Y-axis direction, and includes a first line part 203a extending in X-axis direction, a second line part 203b extending in X-axis direction approximately parallel to the first line part 203a, and a connecting part 203c connecting one end of the first line part 203a (one end at the X-axis direction downstream side (positive direction side)) to one end of the second line part 203b (one end at the X-axis direction downstream side (positive direction side)) such that the first line part 203a and the second line part 203b are successive.

The first line parts 203a of each heat pipe 203 are a part that receives heat from the support member 201, and the first line parts 203a of each heat pipe 203 are inserted into the groove part 201c of the support member 201 and fixed by a fastener or an adhesive not shown, and are thermally coupled with the support member 201 (FIG. 4). In this embodiment, the first line parts 203a of 5 heat pipes 203 are equally arranged at a predetermined interval in Y-axis direction (FIG. 1(d), FIG. D2). Furthermore, as shown in FIG. 4, the length of the first line parts 203a of each heat pipe 203 of this embodiment is approximately equal to the length of X-axis direction of the support member 201.

The second line parts 203b of each heat pipe 203 are a part that radiates heat received by the first line part 203a, and the second line parts 203b of each heat pipe 203 are inserted into and pass through a through-hole 205a of the heat radiating fin 205, and are mechanically and thermally coupled with the heat radiating fin 205 (FIG. 4). In this embodiment, the second line parts 203b of 5 heat pipes 203 are lined up at a predetermined interval in Y-axis direction (FIG. 1(d), FIG. D2). Furthermore, the length of the second line parts 203b of each heat pipe 203 of this embodiment is approximately equal to the length of the first line parts 203a.

As shown in FIG. 4, the connecting parts 203c of each heat pipe 203 protrude from the support member 201 in X-axis direction, extend from one end of the first line part 203a to the Z-axis direction upstream side (negative direction side), and are connected to one end of the second line part 203b. That is, the connecting part 203c turns back to the second line part 203b such that the second line part 203b is approximately parallel to the first line part 203a. Curved parts 203ca and 203cb are formed near the first line part 203a and the second line part 203b of the connecting parts 203c of each heat pipe 203 to prevent buckling of the connecting parts 203c.

Figure 10:
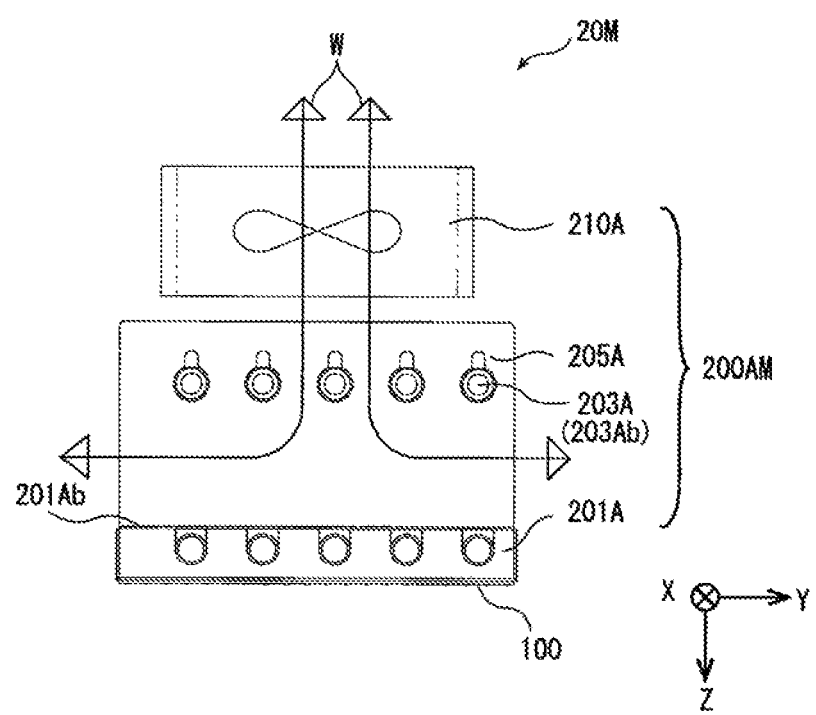
FIG. 10 is a diagram showing the construction of a variation of a heat radiating apparatus according to a second embodiment of the present disclosure.
Figure 11A:
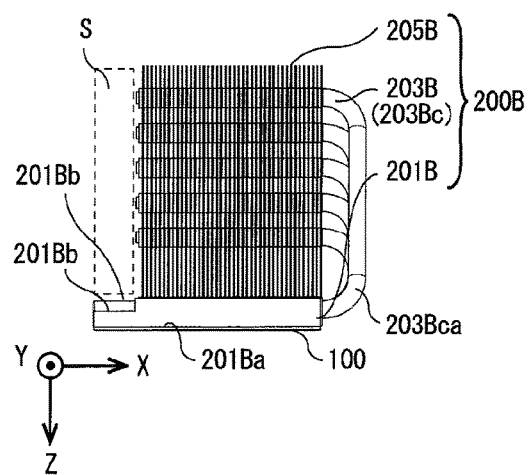
FIGS. 11A, 11B, 11C, and 11D are diagrams of outward appearance schematically illustrating the construction of a light illuminating apparatus with a heat radiating apparatus according to a third embodiment of the present disclosure.
Figure 11B:
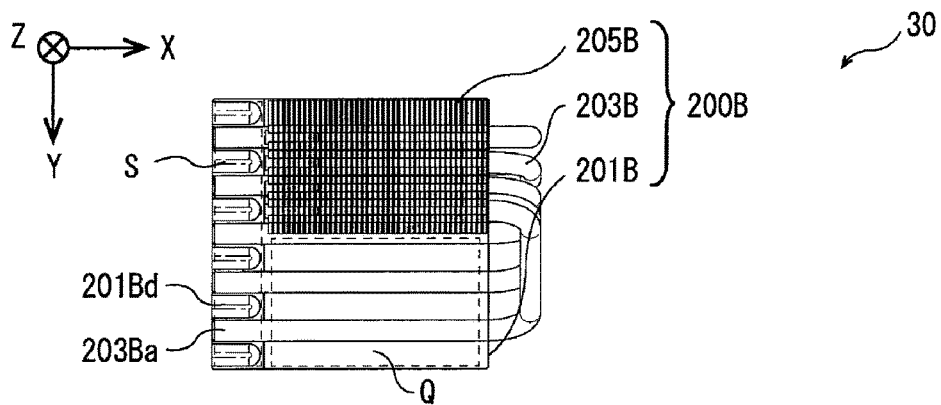
Figure 11C:
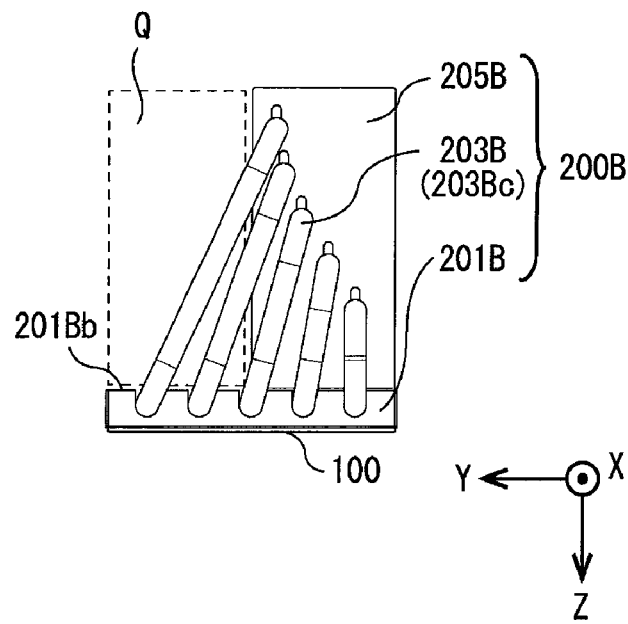
Figure 11D:
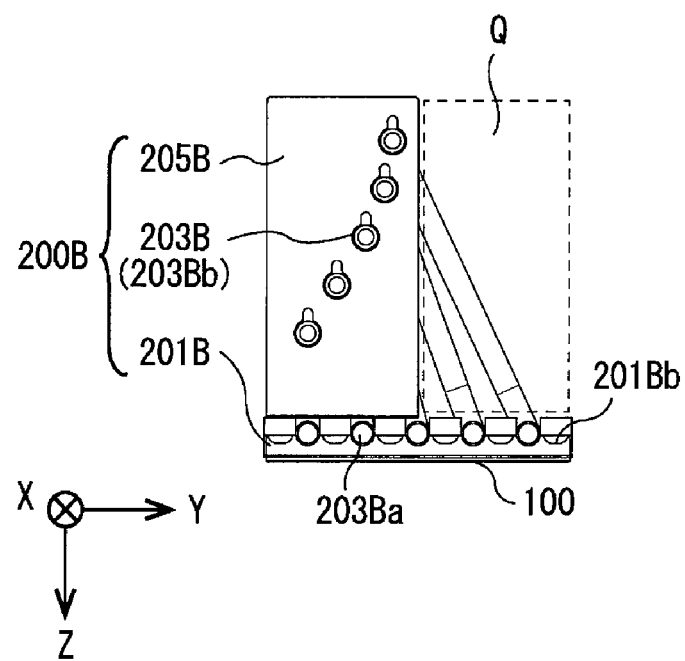

The heat radiating fin 205 is a member of metal (for example, metal such as copper, aluminum, iron and magnesium, or alloys thereof) with a rectangular plate shape. As shown in FIG. 4, each heat radiating fin 205 of this embodiment has the through-hole 205a into which the second line parts 203b of each heat pipe 203 are inserted. In this embodiment, 50 heat radiating fins 205 are inserted into the second line parts 203b of each heat pipe 203 in a sequential order, and are lined up at a predetermined interval in X-axis direction. Furthermore, each heat radiating fin 205 is, at each through-hole 205a, mechanically and thermally coupled with the second line parts 203b of each heat pipe 203 by welding or soldering. Furthermore, the heat radiating fins 205 of this embodiment are placed without deviating from a space that faces the second principal surface 201b of the support member 201 to prevent the interference between the light illuminating apparatuses 10 when connected. Furthermore, as shown in FIGS. 1D and 2, 10 heat radiating fins 205 disposed at the X-axis direction upstream side (negative direction side) have cutouts 205c extending in Z-axis direction to form receiving parts S for receiving connecting parts 203c of heat pipes 203 of adjacent light illuminating apparatus 10D when the light illuminating apparatuses 10 are connected in Y-axis direction. The cutout 205c is placed at the two ends of Y-axis direction of each heat radiating fin 205 and between each heat pipe 203, corresponding to the groove part 201d of the support member 201, and the receiving part S is formed in a space surrounded by the groove part 201d and the cutout 205c.

When the drive current flows into each LED device 110 (FIG. 3) and UV light is emitted from each LED device 110, the temperature increases by self-heat generation of the LED device 110, but heat generated from each LED device 110 is rapidly conducted (moved) to the first line parts 203a of each heat pipe 203 through the substrate 105 and the support member 201. Furthermore, as shown in FIG. 4, when heat is moved to the first line parts 203a of each heat pipe 203, the working fluid in each heat pipe 203 absorbs the heat where it vaporizes, and vapor of the working fluid moves through the hollow in the connecting part 203c and the second line part 203b, allowing the heat of the first line part 203a to move to the second line part 203b. Furthermore, the heat moved to the second line part 203b moves to the plurality of heat radiating fins 205 coupled to the second line part 203b, and is radiated in air from each heat radiating fin 205. When the heat is radiated from each heat radiating fin 205, the temperature of the second line part 203b reduces, and thus, vapor of the working fluid in the second line part 203b is cooled down and returns to liquid, and moves to the first line part 203a. Furthermore, the working fluid moving to the first line part 203a is used to absorb heat conducted newly through the substrate 105a and the support member 201.

As described above, in this embodiment, the working fluid in each heat pipe 203 circulates between the first line part 203a and the second line part 203b, allowing heat generated from each LED device 110 to rapidly move to the heat radiating fin 205 and to be efficiently radiated in air from the heat radiating fin 205. Thereby, the temperature of the LED device 110 does not increase too much, and a problem such as a significant reduction in light emitting efficiency does not occur.

Furthermore, the cooling capacity of the heat radiating apparatus 200 is determined by the amount of transferred heat of the heat pipe 203 and the amount of radiated heat of the heat radiating fin 205. Furthermore, when a temperature difference occurs between each LED device 110 arranged in two dimensions on the substrate 105, an irradiation intensity difference resulting from the temperature characteristics occurs, and accordingly, from the viewpoint of irradiation intensity, it is required to uniformly cool the substrate 105 along X-axis direction and Y-axis direction, and especially because the light illuminating apparatus 10 of this embodiment is configured to allow for connection in X-axis direction and Y-axis direction and the LED device 110 is disposed even near the end part of the support member 201, there is a need to uniformly cool even the proximity of the end part of the support member 201.

Accordingly, the heat radiating apparatus 200 of this embodiment is configured such that the length of the first line parts 203a of each heat pipe 203 is slightly shorter than or equal to the length of X-axis direction of the support member 201 to achieve uniform cooling in X-axis direction. That is, because of being configured to make sure that the first line parts 203a of each heat pipe 203 receive heat from the support member 201 across the two end parts of X-axis direction, uniform cooling is achieved across the two end parts of X-axis direction of the support member 201. Furthermore, with regard to Y-axis direction, the plurality of heat pipes 203 is equally arranged in Y-axis direction, achieving uniform cooling along Y-axis direction as well. Furthermore, as shown in FIG. 4B, a distance d1 from the front end of the first line parts 203a of each heat pipe 203 to the edge of the support member 201 is preferably ½ or less of the size Lx of X-axis direction of the LED device 110 (as shown in FIG. 3).

As described above, according to this embodiment, in Y-axis direction and X-axis direction, a cooling capacity difference is small, thus the substrate 105 (shown in FIG. 3) is equally (approximately uniformly) cooled, and 200 LED devices 110 placed on the substrate 105 are approximately uniformly cooled as well. Accordingly, as a temperature difference between each LED device 110 is small, an irradiation intensity difference resulting from the temperature characteristics is also small. Furthermore, as shown in FIG. 4, the connecting part 203c of the heat pipe 203 of this embodiment is configured to protrude in X-axis direction, while the receiving part S is formed on the side opposite to the side from which the connecting part 203c protrudes (FIG. 2), thereby preventing the interference between the light illuminating apparatuses 10 when connected.

Figure 5C:
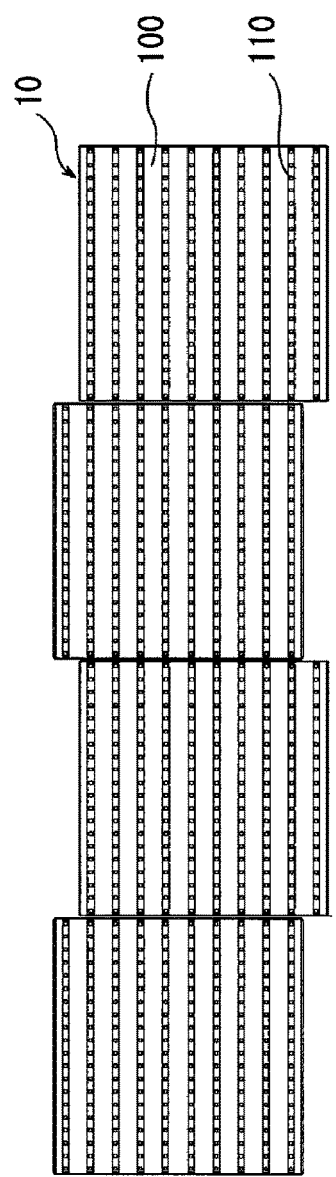

FIG. 5 is a diagram showing that the light illuminating apparatuses 10 of this embodiment are connected in X-axis direction, FIG. 5A is a bottom view (a diagram when viewed from the Z-axis direction upstream side (negative direction side)), FIG. 5B is a plane view (a diagram when viewed from the Y-axis direction downstream side (positive direction side)), and FIG. 5C is a front view (a diagram when viewed from the Z-axis direction downstream side (positive direction side)). As shown in FIG. 5, the light illuminating apparatus 10 of this embodiment is placed such that the connecting parts 203c of the heat pipes 203 protruding from each light illuminating apparatus 10 in X-axis direction are received in the receiving parts S of adjacent light illuminating apparatuses 10, making it possible to connect and arrange the light illuminating apparatuses 10 such that the first principal surfaces 201a of the support members 201 are successive. Accordingly, it is possible to form an irradiation area of a line shape with many sizes according to the specification or the use. Furthermore, as shown in FIG. 2, in this embodiment, because each receiving part S is formed between each heat pipe 203 and at the two ends of Y-axis direction, adjacent light illuminating apparatuses 10 are shifted in Y-axis direction (FIG. 5A), but when the LED devices 110 disposed at the two end parts of Y-axis direction are removed as shown in FIG. 5C, it is possible to enable arrangement such that the LED devices 110 are placed in succession between adjacent light illuminating apparatuses 10.

While this embodiment has been hereinabove described, the present disclosure is not limited to the above construction, and many variations may be made within the scope of the technical spirit of the present disclosure.

For example, although the heat radiating apparatus 200 of this embodiment is configured to include 5 heat pipes 203 arranged at a predetermined interval in Y-axis direction and 50 heat radiating fins 205 as shown in FIG. 1, the number of the heat pipes 203 and the number of the heat radiating fins 205 is not limited thereto. The number of the heat radiating fins 205 is set in relation to the amount of generated heat of the LED device 110 or the temperature of air around the heat radiating fin 205, and is appropriately selected based on a so-called fin area that can radiate the heat generated from the LED device 110. Furthermore, the number of the heat pipes 203 is set in relation to the amount of generated heat of the LED device 110 or the amount of transferred heat of each heat pipe 203, and is appropriately selected so that the heat generated from the LED device 110 can be sufficiently transferred.

Furthermore, although the LED devices 110 are arranged in 20 columns (X-axis direction)×10 rows (Y-axis direction) on the substrate 105 and 5 heat pipes 203 are arranged on the surface side opposite to the substrate 105 in this embodiment, from the viewpoint of cooling efficiency, it is preferred to place each LED device 110 on the substrate 105 at the location opposite to the first line part 203a of each heat pipe 203.

Furthermore, although this embodiment describes that the first line parts 203a and the second line parts 203b of 5 heat pipes 203 are equally arranged at a predetermined interval in Y-axis direction (FIG. 1(d), FIG. D2), the present disclosure is not necessarily limited thereto. The interval of the first line parts 203a and the second line parts 203b may be configured to gradually increase (or decrease) within the limit of forming the receiving part S (namely, if the interval of the first line parts 203a and the interval of the second line parts 203b is wider than the outer diameter of the connecting part 203c, and the connecting part 203c can be received in the receiving part S).

Furthermore, although this embodiment describes natural air cooling of the heat radiating apparatus 200, forced air cooling of the heat radiating apparatus 200 is made possible by further installing a fan in the heat radiating apparatus 200 to supply cooling air.

(Variation 1)

Figure 6:
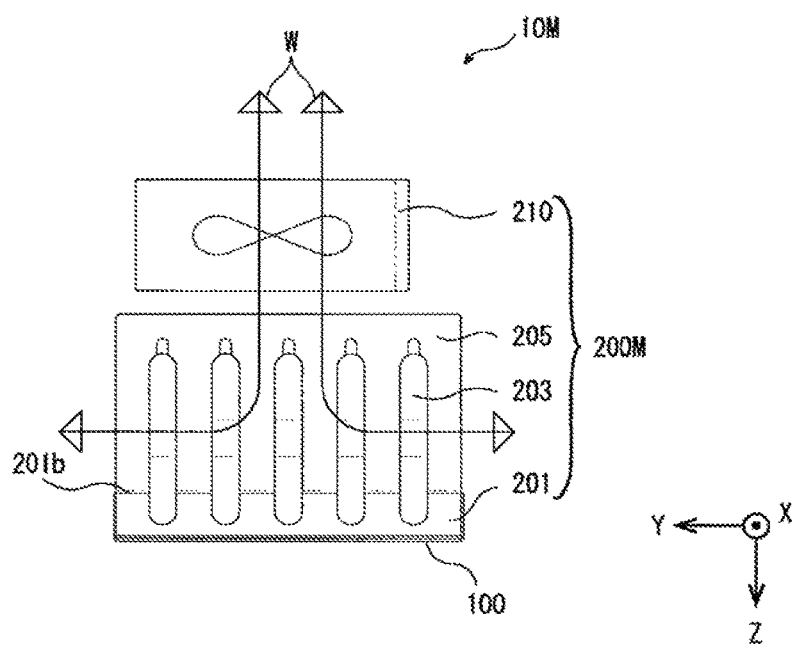
FIG. 6 is a diagram showing the construction of a variation of a heat radiating apparatus according to a first embodiment of the present disclosure.
Figure 7A:
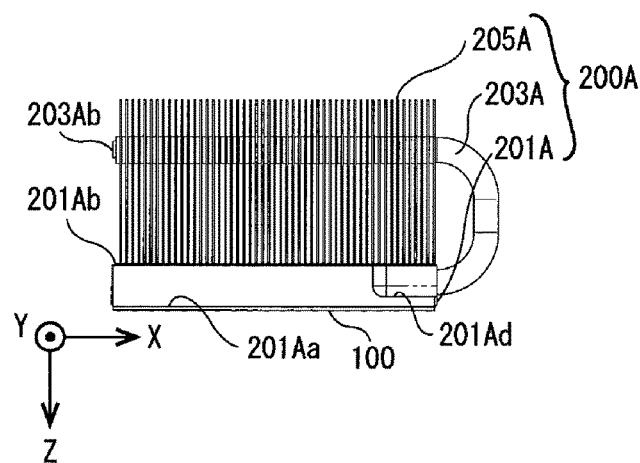
FIGS. 7A, 7B, 7C and 7D are diagrams of outward appearance schematically illustrating the construction of a light illuminating apparatus with a heat radiating apparatus according to a second embodiment of the present disclosure.
Figure 7B:
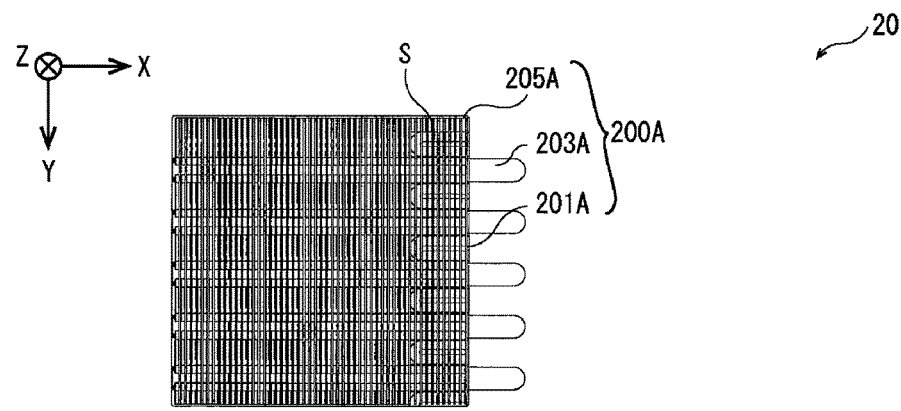
Figure 7C:
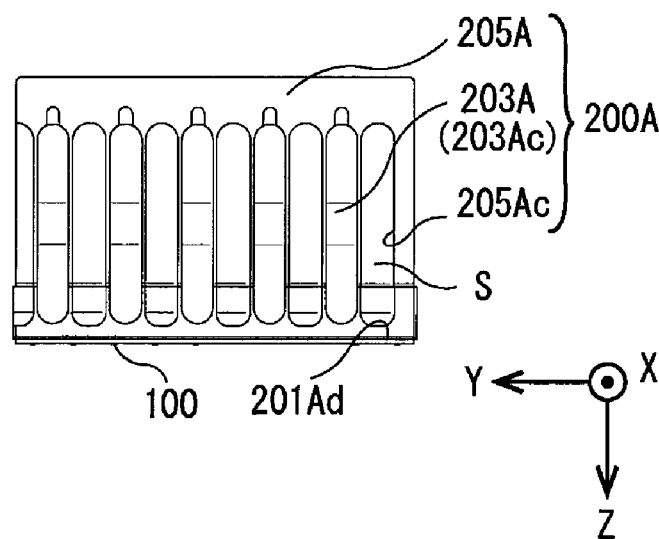
Figure 7D:
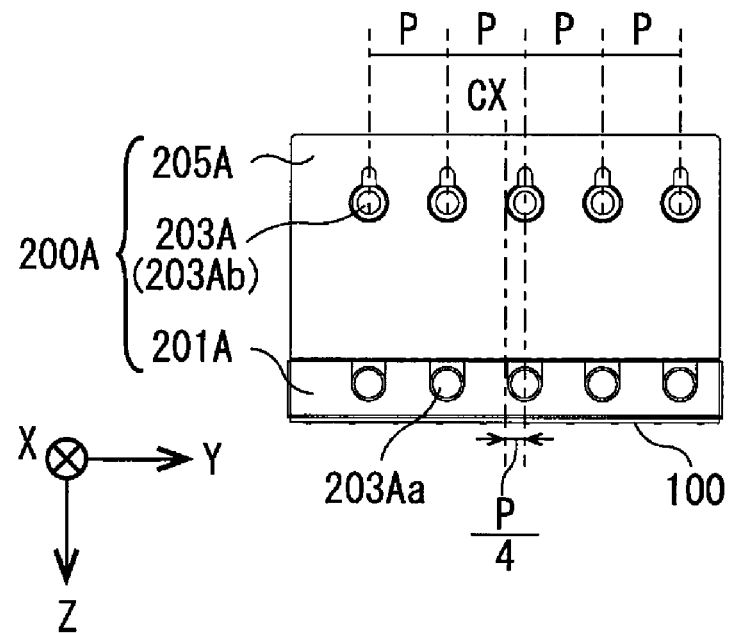

FIG. 6 is a diagram showing a light illuminating apparatus 10M with a heat radiating apparatus 200M according to a variation of the heat radiating apparatus 200 of this embodiment, and is a right side view (a diagram when viewed from the X-axis direction downstream side (positive direction side)) of the light illuminating apparatus 10M of this variation. As shown in FIG. 6, the light illuminating apparatus 10M of this variation is different from the light illuminating apparatus 10 of this embodiment in the respect that the heat radiating apparatus 200M has a cooling fan 210.

The cooling fan 210 is a device that is placed at the Z-axis direction upstream side (negative direction side) of the heat radiating apparatus 200M to supply cooling air to the heat radiating apparatus 200M. As shown in FIG. 6, the cooling fan 210 generates an air current W in a direction perpendicular to the second principal surface 201b of the support member 201 (i.e., a Z-axis direction or a direction opposite to the Z-axis direction). The air current W generated by the cooling fan 210 flows between each heat radiating fin 205 to cool each heat radiating fin 205 as well as the second line parts 203b of each heat pipe 203 that are inserted into and pass through each heat radiating fin 205 (FIG. 1B), and the second principal surface 201b of the support member 201. Accordingly, by the construction of this variation, the cooling capacity of the heat radiating apparatus 200M can be remarkably improved. Furthermore, the cooling fan 210 can be applied to the construction in which the light illuminating apparatuses 10 are connected as shown in FIG. 5, and in this case, one cooling fan 210 may be installed for each heat radiating apparatus 200, and one cooling fan 210 may be installed for the plurality of heat radiating apparatuses 200.

(Second Embodiment)

Figure 8:
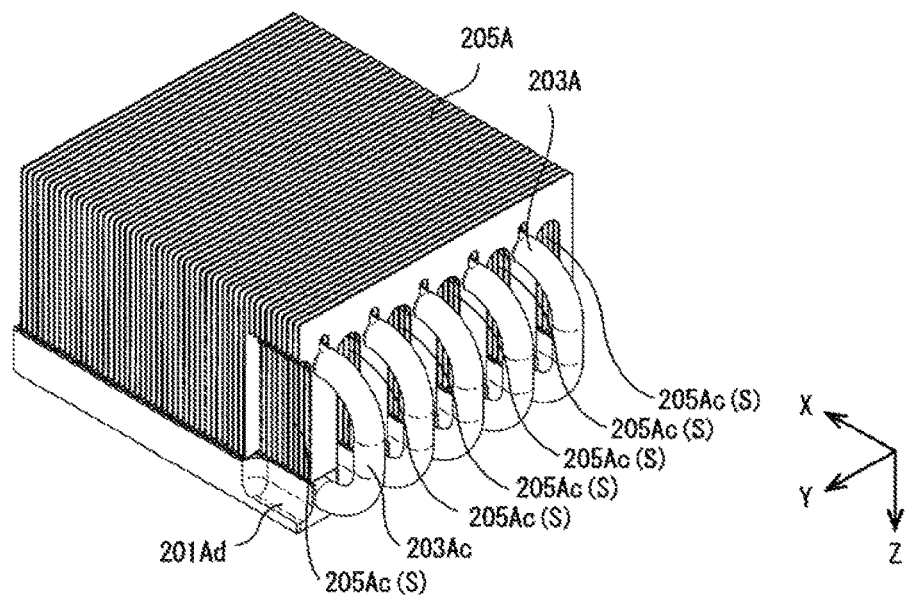
FIG. 8 is a perspective view schematically illustrating the construction of a light illuminating apparatus with a heat radiating apparatus according to a second embodiment of the present disclosure.

FIG. 7 is a diagram of outward appearance schematically illustrating the construction of a light illuminating apparatus 20 with a heat radiating apparatus 200A according to a second embodiment of the present disclosure. FIG. 7A is a plane view (a diagram when viewed from the Y-axis direction downstream side (positive direction side)) of the light illuminating apparatus 20 of this embodiment, FIG. 7B is a bottom view (a diagram when viewed from the Z-axis direction upstream side (negative direction side)), FIG. 7C is a right side view (when viewed from the X-axis direction downstream side (positive direction side)), and FIG. 7D is a left side view (a diagram when viewed from the X-axis direction upstream side (negative direction side)). Furthermore, FIG. 8 is a perspective view of the light illuminating apparatus 20 of this embodiment. The light illuminating apparatus 20 of this embodiment is different from the heat radiating apparatus 200 of the first embodiment in the respect that cutout 205Ac is formed in 10 heat radiating fins 205A disposed at the X-axis direction downstream side (positive direction side) (FIG. 7C, FIG. 8), a groove part 201Ad is formed at the end part of X-axis direction downstream side (positive direction side) of a support member 201A, and the receiving part S for receiving the connecting part 203Ac of the heat pipe 203A of adjacent light illuminating apparatus 10 is formed on the side from which the connecting part 203Ac protrudes (i.e., between the connecting parts 203Ac). Furthermore, as shown in FIG. 7D, this embodiment is different from the heat radiating apparatus 200 of the first embodiment in the respect that when an arrangement interval of each heat pipe 203A in Y-axis direction is P, the location of each heat pipe 203A is offset towards the Y-axis direction downstream side (positive direction side) by the distance equivalent to P/4 with respect to the center line CX of the support member 201A and the heat radiating fin 205A.

Figure 9A:
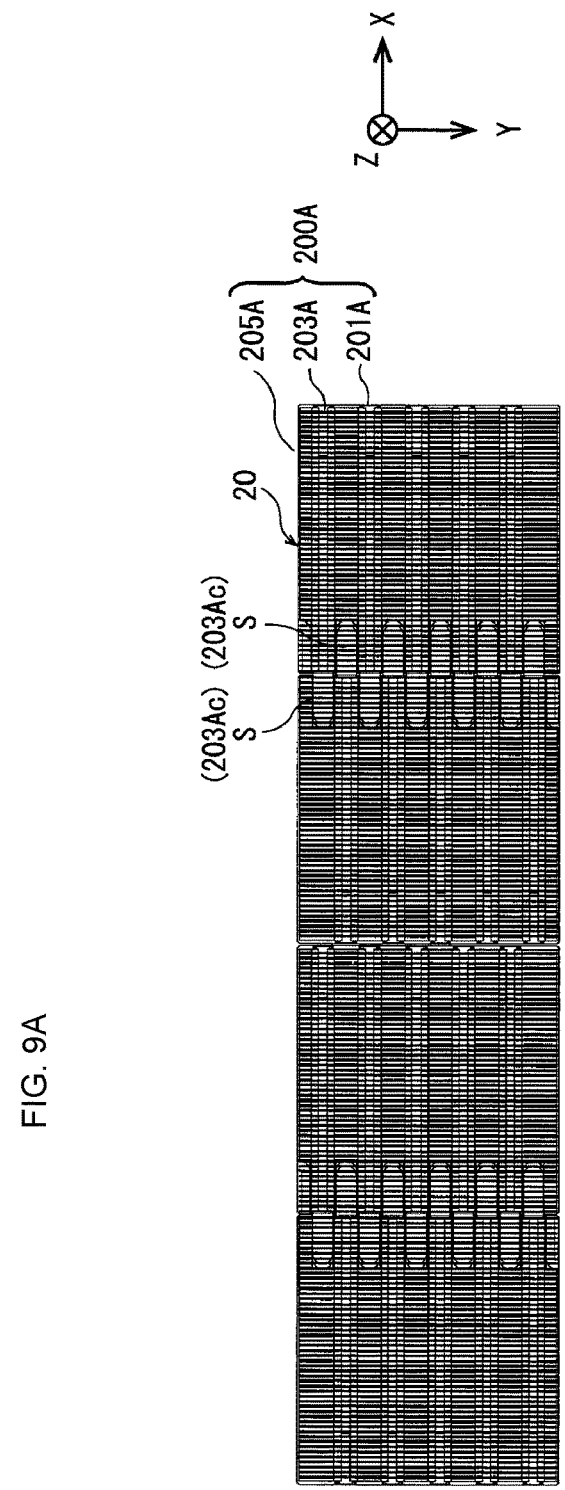
FIGS. 9A, 9B, and 9C are diagrams showing that heat radiating apparatuses according to a second embodiment of the present disclosure are connected.
Figure 9B:
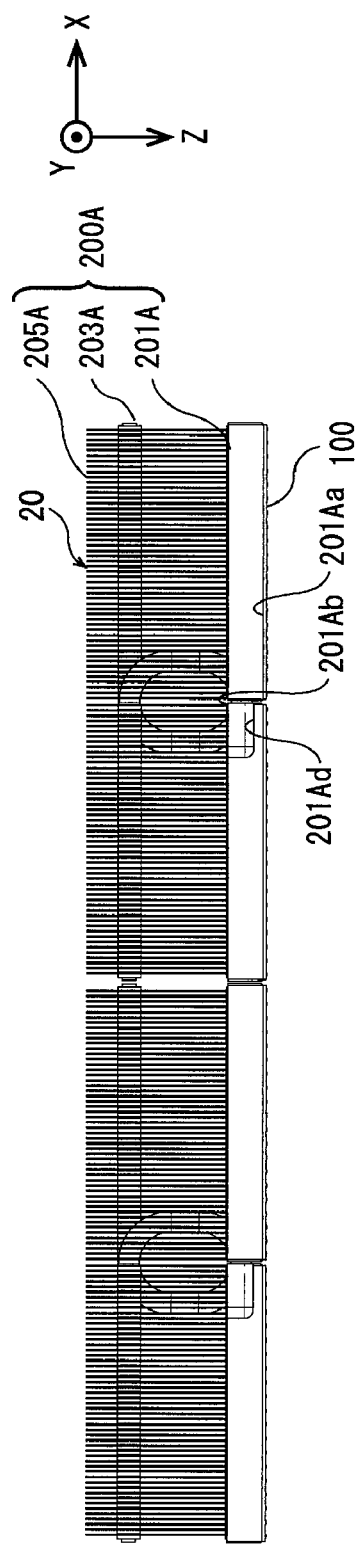
Figure 9C:
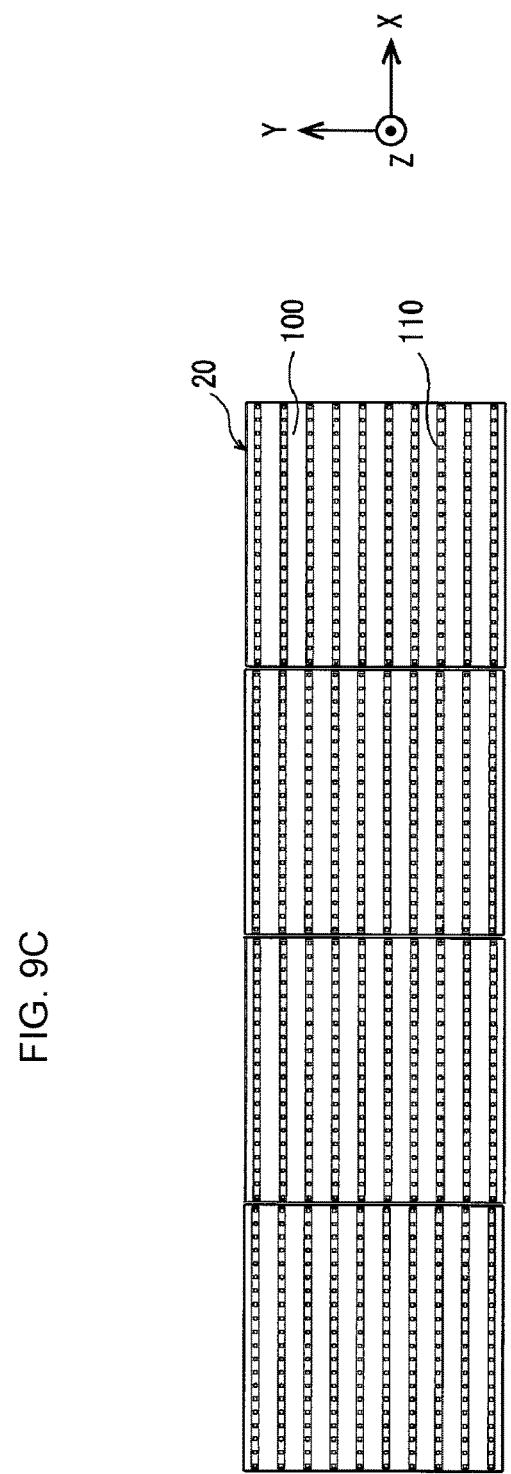

FIG. 9 is a diagram showing that heat radiating apparatuses 20 of this embodiment are connected in X-axis direction, FIG. 9A is a bottom view (a diagram when viewed from the Z-axis direction upstream side (negative direction side)), FIG. 9B is a plane view (a diagram when viewed from the Y-axis direction downstream side (positive direction side)), and FIG. 9C is a front view (a diagram when viewed from the Z-axis direction downstream side (positive direction side)). As shown in FIGS. 8 and 9, in the light illuminating apparatus 20 of this embodiment, because the receiving part S is formed on the side from which the connecting part 203Ac protrudes (i.e., between the connecting parts 203Ac), the light illuminating apparatus 20 (in FIG. 9, second and fourth light illuminating apparatuses 20 from the right side) with the connecting part 203Ac facing the X-axis direction downstream side (positive direction side) and the light illuminating apparatus 20 (in FIG. 9, first and third light illuminating apparatuses 20 from the right side) with the connecting part 203Ac facing the X-axis direction upstream side (negative direction side) can be connected as a set. That is, because the light illuminating apparatus 20 with the connecting part 203Ac facing the X-axis direction downstream side (positive direction side) and the light illuminating apparatus 20 with the connecting part 203Ac facing the X-axis direction downstream side (positive direction side) are 180° different in direction, the locations of each heat pipe 203A of the two are spaced a distance equivalent to P/2 apart, and when each heat pipe 203A of the light illuminating apparatus 20 on the other side is inserted into the receiving part S of the light illuminating apparatus 20 on one side and each heat pipe 203A of the light illuminating apparatus 20 on one side is inserted into the receiving part S of the light illuminating apparatus 20 on the other side, the two are joined without shift in Y-axis direction. Accordingly, when the support members 201A of a set of light illuminating apparatuses 20 are joined, the light illuminating apparatuses 20 are connected and arranged such that the first principal surfaces 201Aa of the support members 201A are successive, and the LED devices 110 are placed in succession between the set of light illuminating apparatuses 20C. Furthermore, as shown in FIG. 9, when the light illuminating apparatus 20 with the connecting part 203Ac facing the X-axis direction downstream side (positive direction side) and the light illuminating apparatus 20 with the connecting part 203Ac facing the X-axis direction upstream side (negative direction side) are connected as a set, each heat pipe 203A does not protrude in X-axis direction, thus making it possible to further connect a plurality of sets of light illuminating apparatuses 20 in X-axis direction.

(Variation 2)

FIG. 10 is a left side view (a diagram when viewed from the X-axis direction upstream side (negative direction side)) of a light illuminating apparatus 20M with a heat radiating apparatus 200AM according to a variation of the heat radiating apparatus 200A of this embodiment. As shown in FIG. 10, the light illuminating apparatus 20M of this variation is different from the light illuminating apparatus 20 of this embodiment in the respect that the heat radiating apparatus 200AM has a cooling fan 210A.

The cooling fan 210A is a device that is placed at the Z-axis direction upstream side (negative direction side) of the heat radiating apparatus 200AM to supply cooling air to the heat radiating apparatus 200AM in the same way as the cooling fan 210 of variation 1. The air current W generated by the cooling fan 210A flows between each heat radiating fin 205A to cool each heat radiating fin 205A as well as second line parts 203Ab of each heat pipe 203A that are inserted into and pass through each heat radiating fin 205AB, and a second principal surface 201Ab of the support member 201A. Accordingly, by the construction of this variation, the cooling capacity of the heat radiating apparatus 200AM can be remarkably improved. Furthermore, the cooling fan 210A can be applied to the construction in which the light illuminating apparatuses 20 are connected as shown in FIG. 9, and in this case, one cooling fan 210A may be installed for each heat radiating apparatus 200A, and one cooling fan 210A may be installed for the plurality of heat radiating apparatuses 200A.

(Third Embodiment)

Figure 12A:
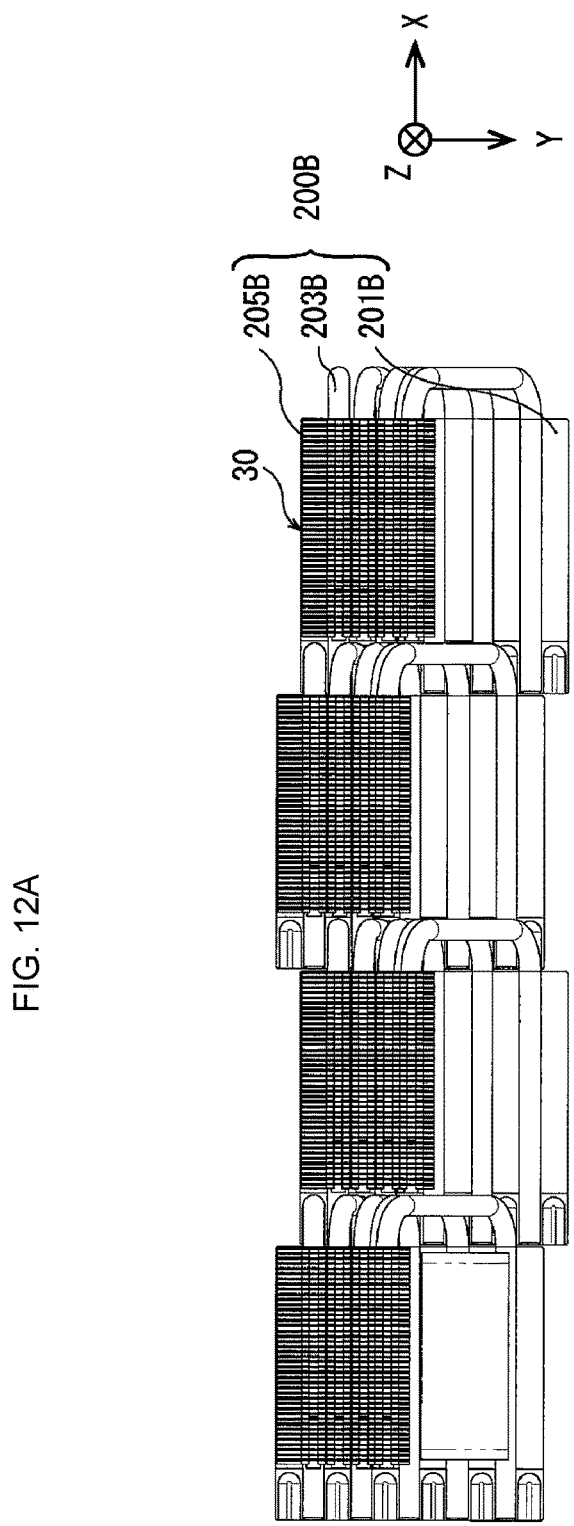

FIG. 11 is a diagram of outward appearance schematically illustrating the construction of a light illuminating apparatus 30 with a heat radiating apparatus 200B according to a third embodiment of the present disclosure. FIG. 11A is a plane view (a diagram when viewed from Y-axis direction downstream side (positive direction side)) of the light illuminating apparatus 30 of this embodiment, FIG. 11B is a bottom view (a diagram when viewed from the Z-axis direction upstream side (negative direction side)), FIG. 11C is a right side view (a diagram when viewed from the X-axis direction downstream side (positive direction side)), and FIG. 11D is a left side view (a diagram when viewed from the X-axis direction upstream side (negative direction side)). The light illuminating apparatus 30 of this embodiment is different from the heat radiating apparatus 200 of the first embodiment in the respect that the location of second line parts 203Bb of each heat pipe 203B differs in Y-axis direction and Z-axis direction when viewed in X-axis direction (FIG. 11D), the length of connecting parts 203Bc of each heat pipe 203B (FIG. 11A, FIG. 11C) differs respectively, heat radiating fins 205B are formed at the Y-axis direction upstream side (negative direction side) of the second principal surface 201Bb of the support member 201B, and a space Q (FIG. 11B, FIG. 11C, FIG. 11D) is formed at the Y-axis direction downstream side (positive direction side) of the second principal surface 201Bb of the support member 201B. Furthermore, in this embodiment, the length of the second line parts 203Bb of each heat pipe 203B is shorter than first line parts 203Ba, and the receiving part S for receiving the connecting part 203Bc of the heat pipe 203B of adjacent light illuminating apparatus 30 is formed at further X-axis direction upstream side (negative direction side) than the front end of the second line part 203Bb. Furthermore, when the light illuminating apparatuses 30 are connected in X-axis direction, a groove part 201Bd for receiving the curved part 203Bca of the heat pipe 203B of adjacent light illuminating apparatus 30 is formed adjacent to the front end part of the first line parts 203Ba of each heat pipe 203B at the end part of X-axis direction upstream side (negative direction side) of the second principal surface 201Bb of the support member 201B. By this construction, other component (for example, a cooling fan and a LED driving circuit) may be placed in the space Q. Furthermore, because the light illuminating apparatus 30 of this embodiment has the receiving part S for receiving the connecting part 203Bc of the heat pipe 203B of adjacent light illuminating apparatus 30 in the same way as the light illuminating apparatus 10 of the first embodiment, it is possible to enable connection and arrangement by joining the support members 201B such that the first principal surfaces 201Ba of the support members 201B are successive as shown in FIG. 12. Furthermore, in this embodiment, because the groove part 201Bd is formed between each heat pipe 203B, adjacent light illuminating apparatuses 30 are shifted in Y-axis direction (FIG. 12A, FIG. 12C).

(Variation 3)

Figure 13:
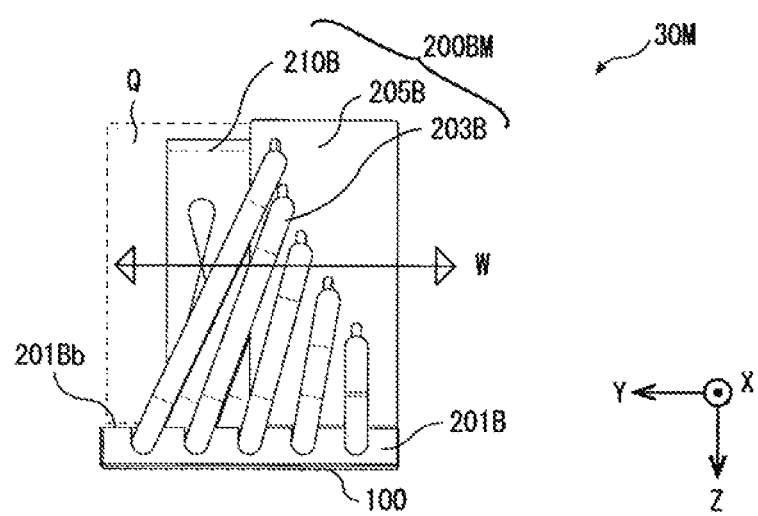
FIG. 13 is a diagram showing the construction of a variation of a heat radiating apparatus according to a third embodiment of the present disclosure.
Figure 14A:
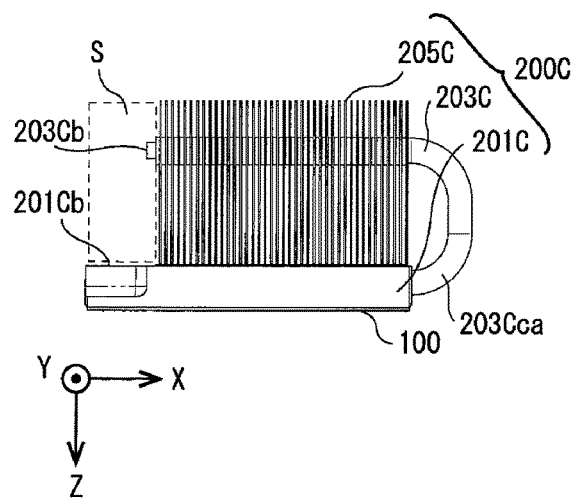
FIGS. 14A, 14B, 14C, and 14D are a diagram of outward appearance schematically illustrating the construction of a light illuminating apparatus with a heat radiating apparatus according to a fourth embodiment of the present disclosure.
Figure 14B:
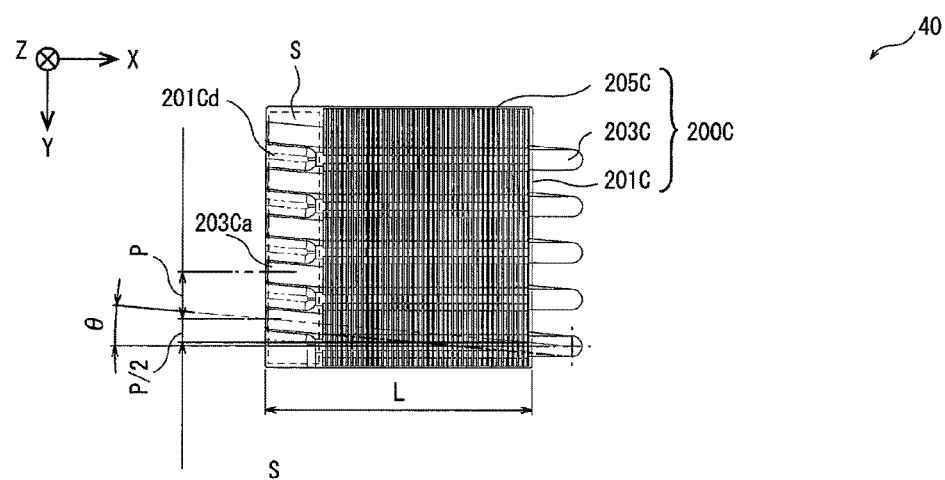
Figure 14C:
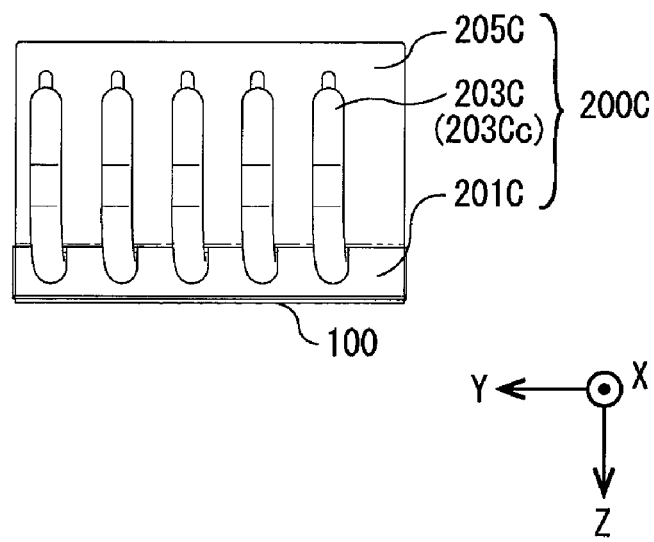
Figure 14D:
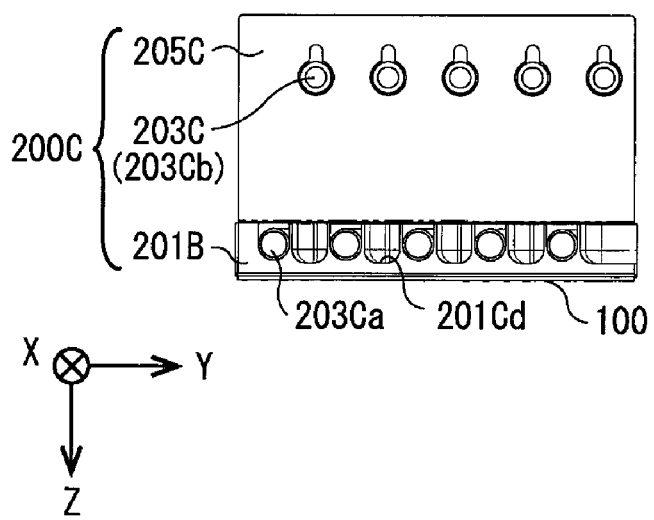

FIG. 13 is a right side view (a diagram when viewed from the X-axis direction downstream side (positive direction side) of a light illuminating apparatus 30M with a heat radiating apparatus 200BM according to a variation of the heat radiating apparatus 200B of this embodiment. As shown in the drawing, the light illuminating apparatus 30M of this variation is different from the light illuminating apparatus 30 of this embodiment in the respect that the heat radiating apparatus 200BM has a cooling fan 210B.

The cooling fan 210B is a device that is placed in the space Q on the second principal surface 201Bb of the support member 201B to supply cooling air to the heat radiating apparatus 200BM. As shown in FIG. 13, the cooling fan 210B of this variation generates an air current W in a direction approximately parallel to the second principal surface 201Bb of the support member 201B (i.e., a Y-axis direction or a direction opposite to the Y-axis direction). The air current W generated by the cooling fan 210B flows between each heat radiating fin 205B to cool each heat radiating fin 205B, as well as the second line parts 203Bb (FIG. 11A) of each heat pipe 203B that are inserted into and pass through each heat radiating fin 205B. In this variation, because the location of the second line parts 203Bb of each heat pipe 203B differs in Z-axis direction, the air current W generated by the cooling fan 210B certainly hits each second line part 203Bb. Accordingly, by the construction of this variation, the cooling capacity of the heat radiating apparatus 200BM can be remarkably improved. Furthermore, the cooling fan 210B can be applied to the construction in which the light illuminating apparatuses 30 are connected as shown in FIG. 12, and in this case, one cooling fan 210B may be formed for each heat radiating apparatus 200B, and one cooling fan 210B may be formed for the plurality of heat radiating apparatuses 200B.

(Fourth Embodiment)

FIG. 14 is a diagram of outward appearance schematically illustrating the construction of a light illuminating apparatus 40 with a heat radiating apparatus 200C according to a fourth embodiment of the present disclosure. FIG. 14A is a plane view (a diagram when viewed from the Y-axis direction downstream side (positive direction side)) of the light illuminating apparatus 40 of this embodiment, FIG. 14B is a bottom view (a diagram when viewed from the Z-axis direction upstream side (negative direction side)), FIG. 14C is a right side view (a diagram when viewed from the X-axis direction downstream side (positive direction side)), and FIG. 14D is a left side view (a diagram when viewed from the X-axis direction upstream side (negative direction side)). As shown in FIG. 14B, the light illuminating apparatus 40 of this embodiment is different from the heat radiating apparatus 200 of the first embodiment in the respect that first line parts 203Ca of each heat pipe 203C are inclined with respect to X-axis direction, and thus, the first line parts 203Ca and second line parts 203Cb are in staggered positions. In this embodiment, as the first line parts 203Ca of each heat pipe 203C are inclined with respect to X-axis direction, the location of a groove part 201Cd for receiving a curved part 203Cca of the heat pipe 203C of adjacent light illuminating apparatus 40 is shifted in Y-axis direction. That is, the groove part 201Cd is formed adjacent to the front end part of the first line parts 203Ca of each heat pipe 203C, but the first line parts 203Ca of each heat pipe 203C are inclined with respect to X-axis direction, making the location of Y-axis direction of the groove part 201Cd roughly match the location of the curved parts 203Cca of each heat pipe 203C. Specifically, as shown in FIG. 14B, at the end part of X-axis direction upstream side (negative direction side) of the support member 201C, the front end of the first line part 203Ca of each heat pipe 203C is inclined by a distance equivalent to ½ of an arrangement pitch P of each heat pipe 203C, and an angle of inclination 8 of the first line part 203Ca relative to X-axis direction may be expressed by the following equation (1) where the length of X-axis direction of the support member 201C is L, and the arrangement pitch of each heat pipe 203C is P:

$$\theta = \tan^{-1}\{(P/2) \div (L)\} \quad (1)$$

Figure 15A:
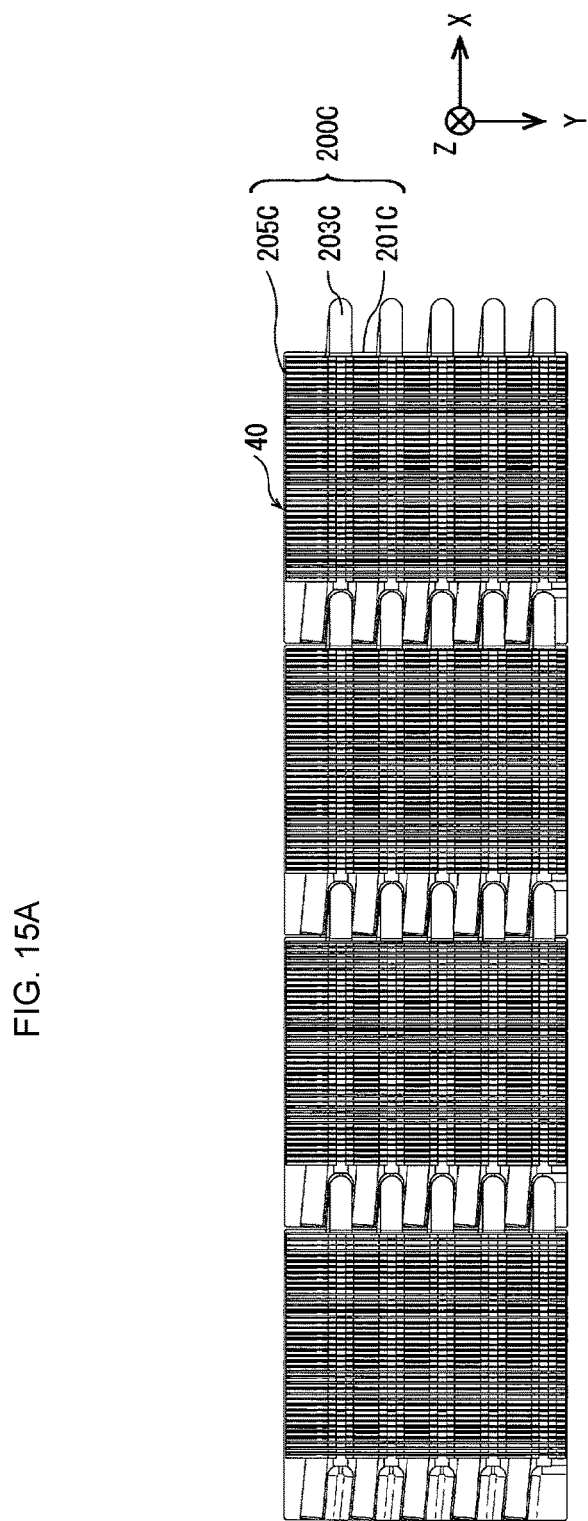
Figure 15B:
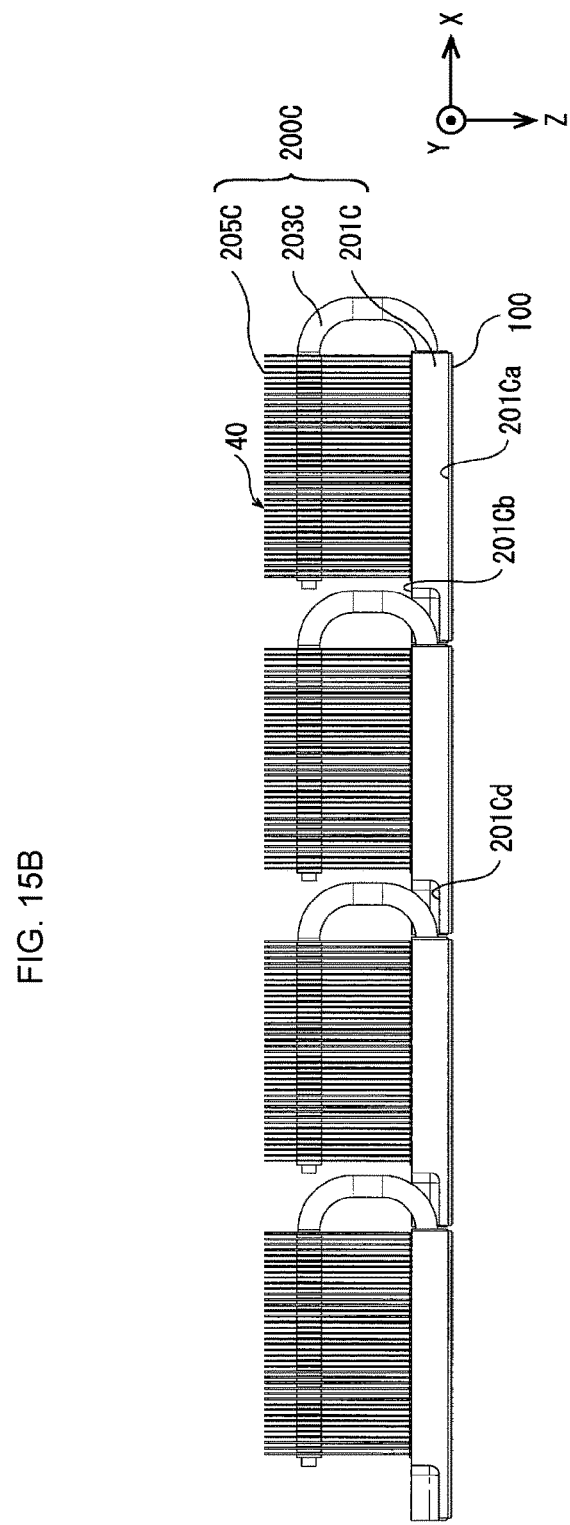

Furthermore, in this embodiment, the length of the second line parts 203Cb of each heat pipe 203C is shorter than the first line part 203Ca, and the receiving part S for receiving the connecting part 203Cc of the heat pipe 203C of adjacent light illuminating apparatus 40 is formed at further X-axis direction upstream side (negative direction side) than the front end of the second line part 203Cb. Accordingly, in the same way as the light illuminating apparatus 10 of the first embodiment, the light illuminating apparatus 40 of this embodiment allows for connection and arrangement by joining the support members 201C such that the first principal surfaces 201Ca of the support members 201C are successive as shown in FIG. 15. Furthermore, because this embodiment is configured such that the location of Y-axis direction of the groove part 201Cd roughly matches the location of the curved parts 203Cca of each heat pipe 203C, adjacent light illuminating apparatuses 40 are joined without shift in Y-axis direction.

(Variation 4)

Figure 16:
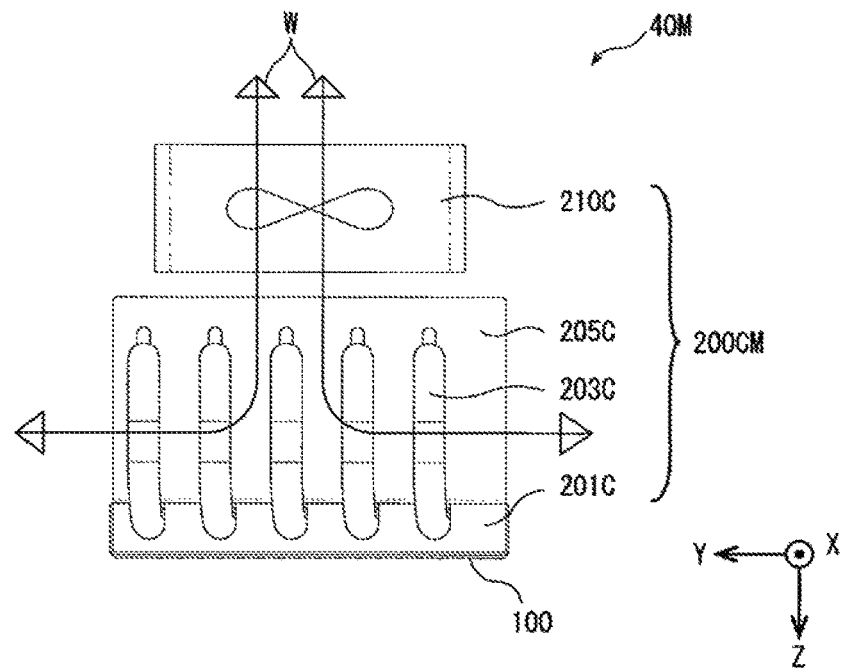
FIG. 16 is a diagram showing the construction of a variation of a heat radiating apparatus according to a fourth embodiment of the present disclosure.
Figure 17A:
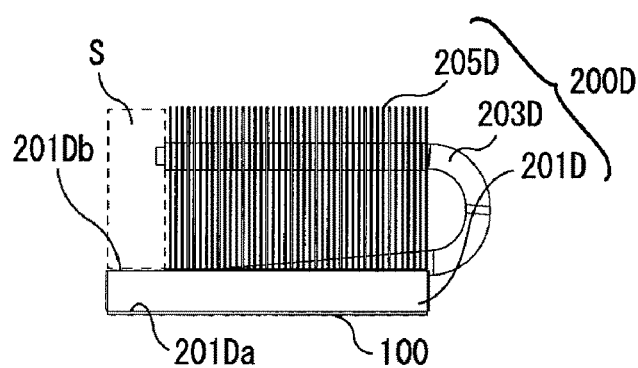
FIGS. 17A, 17B, 17C are 17D are diagrams of outward appearance schematically illustrating the construction of a light illuminating apparatus with a heat radiating apparatus according to a fifth embodiment of the present disclosure.
Figure 17A:
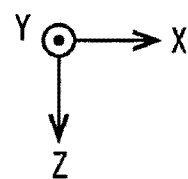
Figure 17B:
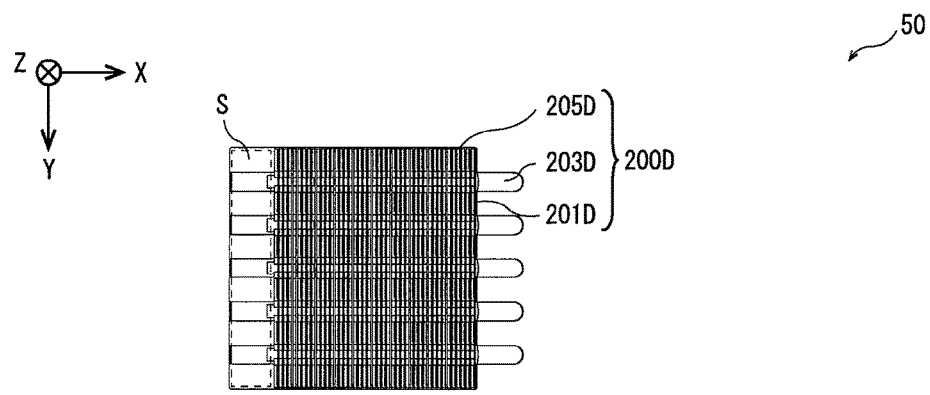
Figure 17C:
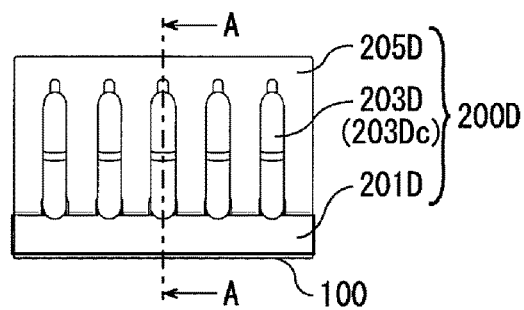
Figure 17C:
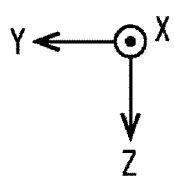
Figure 17D:
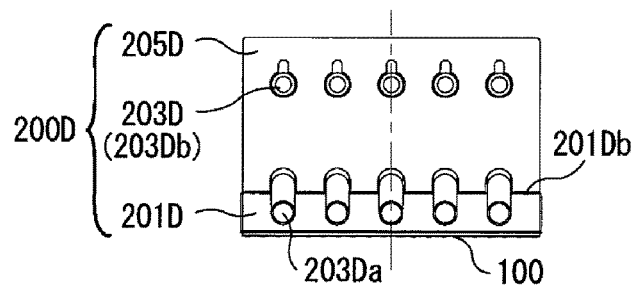
Figure 17D:
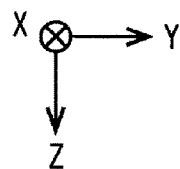

FIG. 16 is a left side view (a diagram when viewed from the X-axis direction upstream side (negative direction side)) of a light illuminating apparatus 40M with a heat radiating apparatus 200CM according to a variation of the heat radiating apparatus 200C of this embodiment. As shown in FIG. 16, the light illuminating apparatus 40M of this variation is different from the light illuminating apparatus 40 of this embodiment in the respect that the heat radiating apparatus 200CM has a cooling fan 210C.

The cooling fan 210C is a device that is placed at the Z-axis direction upstream side (negative direction side) of the apparatus 200CM to supply cooling air to the heat radiating apparatus 200CM in the same way as the cooling fan 210 of variation 1. The air current W generated by the cooling fan 210C flows between each heat radiating fin 205C to cool each heat radiating fin 205C, as well as the second line parts 203Cb of each heat pipe 203C that are inserted into and pass through each heat radiating fin 205C (FIG. 14A), and the second principal surface 201Cb of the support member 201C. Accordingly, by the construction of this variation, the cooling capacity of the heat radiating apparatus 200CM can be remarkably improved. Furthermore, the cooling fan 210C can be applied to the construction in which the light illuminating apparatuses 40 are connected as shown in FIG. 15, and in this case, one cooling fan 210C may be installed for each heat radiating apparatus 200C, and one cooling fan 210C may be installed for the plurality of heat radiating apparatuses 200C.

(Fifth Embodiment)

Figure 18:
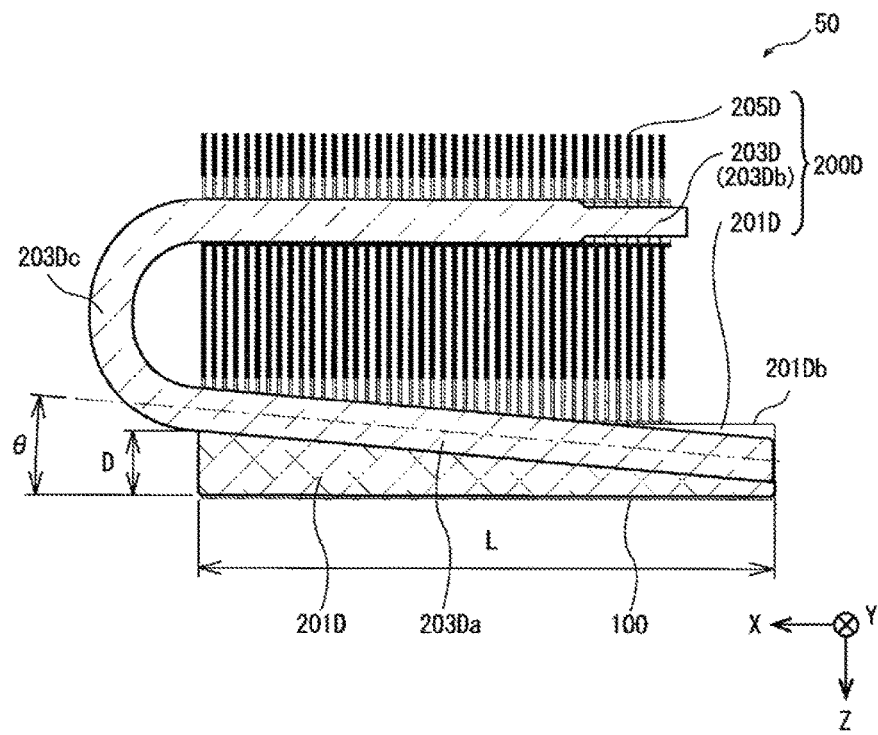
FIG. 18 is a cross sectional view illustrating the construction of a heat radiating apparatus according to a fifth embodiment of the present disclosure.

FIG. 17 is a diagram of outward appearance schematically illustrating the construction of a light illuminating apparatus 50 with a heat radiating apparatus 200D according to a fifth embodiment of the present disclosure. FIG. 17A is a plane view (a diagram when viewed from the Y-axis direction downstream side (positive direction side)) of the light illuminating apparatus 50 of this embodiment, FIG. 17B is a bottom view (a diagram when viewed from the Z-axis direction upstream side (negative direction side)), FIG. 17C is a right side view (a diagram when viewed from the X-axis direction downstream side (positive direction side)), and FIG. 17D is a left side view (a diagram when viewed from the X-axis direction upstream side (negative direction side)). Furthermore, FIG. 18 is a cross sectional view taken along the line A-A in FIG. 17C. As shown in FIG. 18, the light illuminating apparatus 50 of this embodiment is different from the heat radiating apparatus 200 of the first embodiment in the respect that first line parts 203Da of each heat pipe 203D are inclined with respect to a second principal surface 201Db (i.e., X-axis direction) when viewed in Y-axis direction, and connecting parts 203Dc of each heat pipe 203D protrude in a direction deviating from the second principal surface 201Db. Furthermore, as shown in FIG. 17, in this embodiment, the length of second line parts 203Db of each heat pipe 203D is shorter than the first line part 203Da, and the receiving part S for receiving the connecting part 203Dc of the heat pipe 203D of adjacent light illuminating apparatus 50 is formed at further X-axis direction upstream side (negative direction side) than the front end of the second line part 203Db (FIG. 17A, FIG. 17B). That is, as this embodiment is configured such that the first line parts 203Da of each heat pipe 203D are inclined with respect to the second principal surface 201Db, the connecting parts 203Dc of each heat pipe 203D are disposed at further Z-axis direction upstream side (negative direction side) than the second principal surface 201Db, and specifically, at the end part of X-axis direction downstream side (positive direction side) of the support member 201D, the base of the first line parts 203Da of each heat pipe 203D is inclined by a distance equivalent to the outer diameter of each heat pipe 203D, an angle of inclination θ of the first line part 203Da relative to X-axis direction may be expressed by the following equation (2) where the length of X-axis direction of the support member 201D is L and the outer diameter of each heat pipe 203D is D:

$$\theta = \tan^{-1}\{(D/2) \div (L)\} \quad (2)$$

Figure 19A:
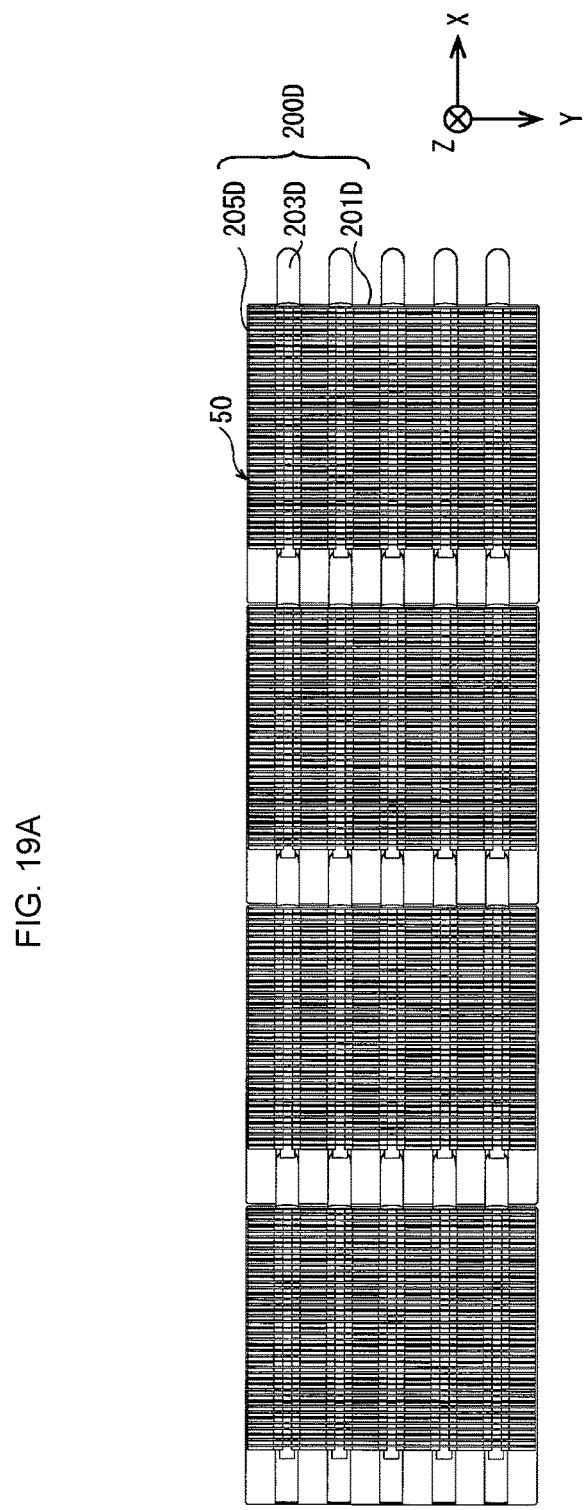
FIGS. 19A, 19B and 19C are diagrams showing that heat radiating apparatuses according to a fifth embodiment of the present disclosure are connected.
Figure 19B:
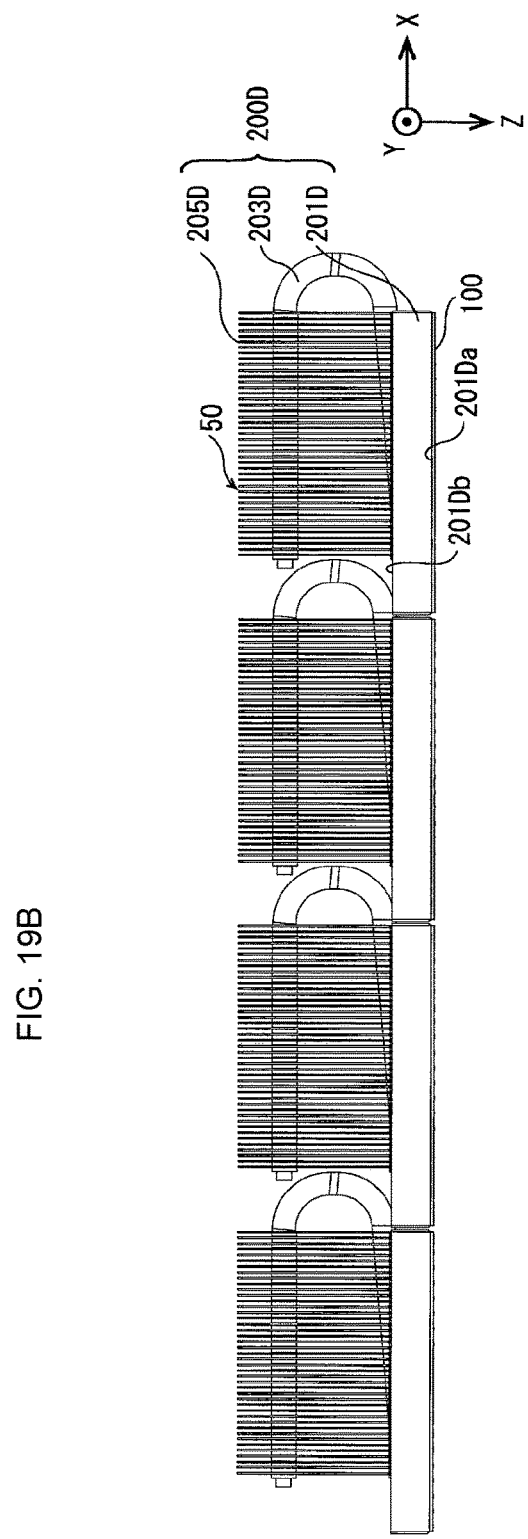
Figure 19C:
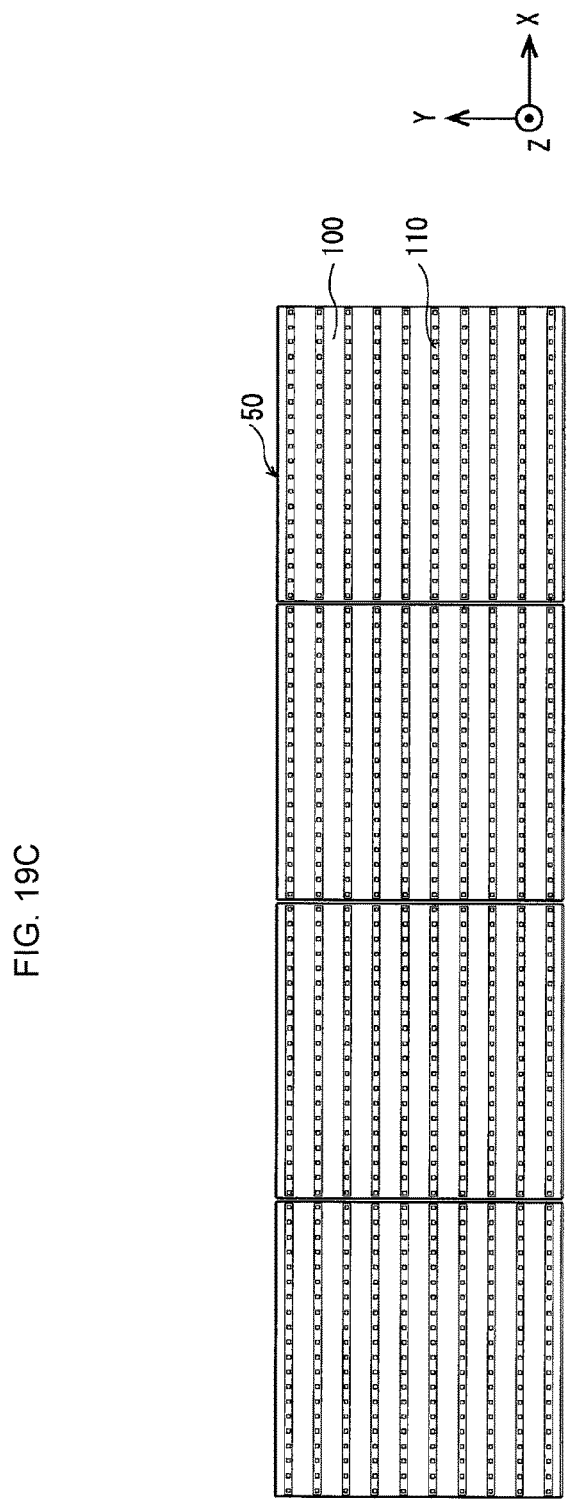

Because the light illuminating apparatus 50 of this embodiment has the receiving part S for receiving the connecting part 203Dc of the heat pipe 203D of adjacent light illuminating apparatus 50 in the same way as the light illuminating apparatus 10 of the first embodiment, it is possible to enable connection and arrangement by joining the support members 201D such that the first principal surfaces 201Da of the support members 201D are successive as shown in FIG. 19. Furthermore, in this embodiment, the connecting part 203Dc is disposed at further Z-axis direction upstream side (negative direction side) than the second principal surface 201Db, thereby preventing the interference between the support members 201D of adjacent light illuminating apparatuses 50, and thus, the two are joined without shift in Y-axis direction.

(Variation 5)

Figure 20:
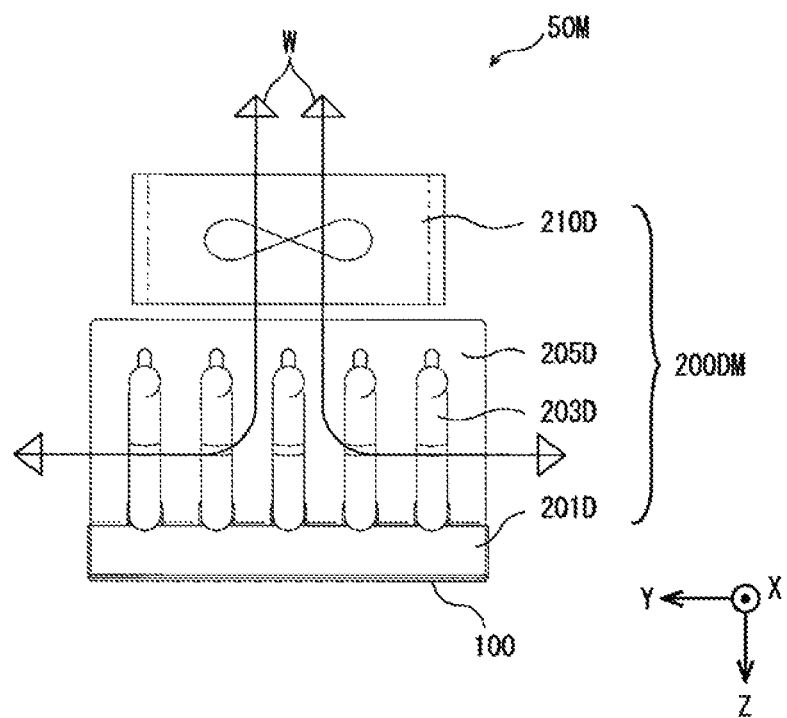
FIG. 20 is a diagram showing the construction of a variation of a heat radiating apparatus according to a fifth embodiment of the present disclosure.
Figure 21A:
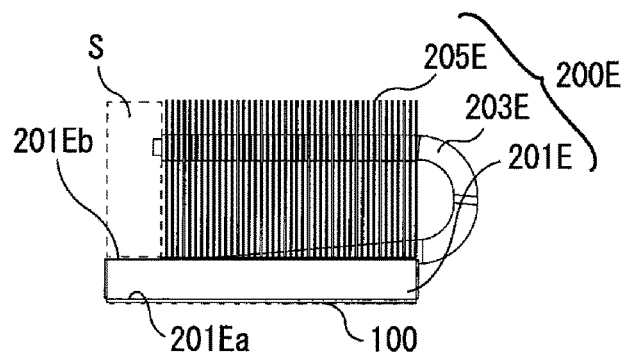
FIGS. 21A, 21B, 21C and 21D are diagrams of outward appearance schematically illustrating the construction of a light illuminating apparatus with a heat radiating apparatus according to a sixth embodiment of the present disclosure.
Figure 21A:
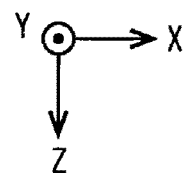
Figure 21B:
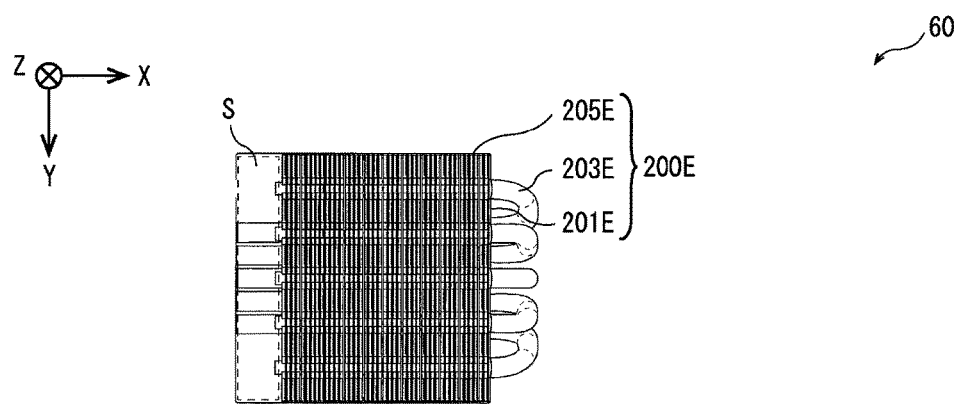
Figure 21C:
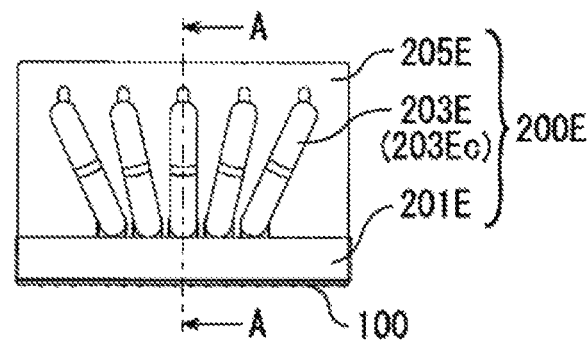
Figure 21C:
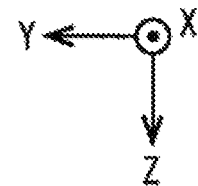
Figure 21D:
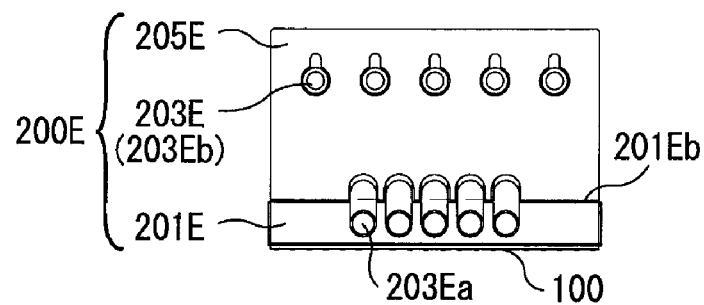
Figure 21D:
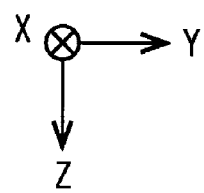

FIG. 20 is a right side view (a diagram when viewed from the X-axis direction downstream (positive direction side)) of a light illuminating apparatus 50M with a heat radiating apparatus 200DM according to a variation of the heat radiating apparatus 200D of this embodiment. As shown in FIG. 20, the light illuminating apparatus 50M of this variation is different from the light illuminating apparatus 50 of this embodiment in the respect that the heat radiating apparatus 200DM has a cooling fan 210D.

The cooling fan 210D is a device that is placed at the Z-axis direction upstream side (negative direction side) of the heat radiating apparatus 200DM to supply cooling air to the heat radiating apparatus 200DM in the same way as the cooling fan 210 of variation 1. The air current W generated by the cooling fan 210D flows between each heat radiating fin 205D to cool each heat radiating fin 205D, as well as the second line parts 203Db of each heat pipe 203D that are inserted into and pass through each heat radiating fin 205D (FIG. 17A), and the second principal surface 201Db of the support member 201D. Accordingly, by the construction of this variation, the cooling capacity of the heat radiating apparatus 200DM can be remarkably improved. Furthermore, the cooling fan 210D can be applied to the construction in which the light illuminating apparatuses 50 are connected as shown in FIG. 19, and in this case, one cooling fan 210D may be formed for each heat radiating apparatus 200D, and one cooling fan 210D may be formed for the plurality of heat radiating apparatuses 200D.

(Sixth Embodiment)

Figure 22A:
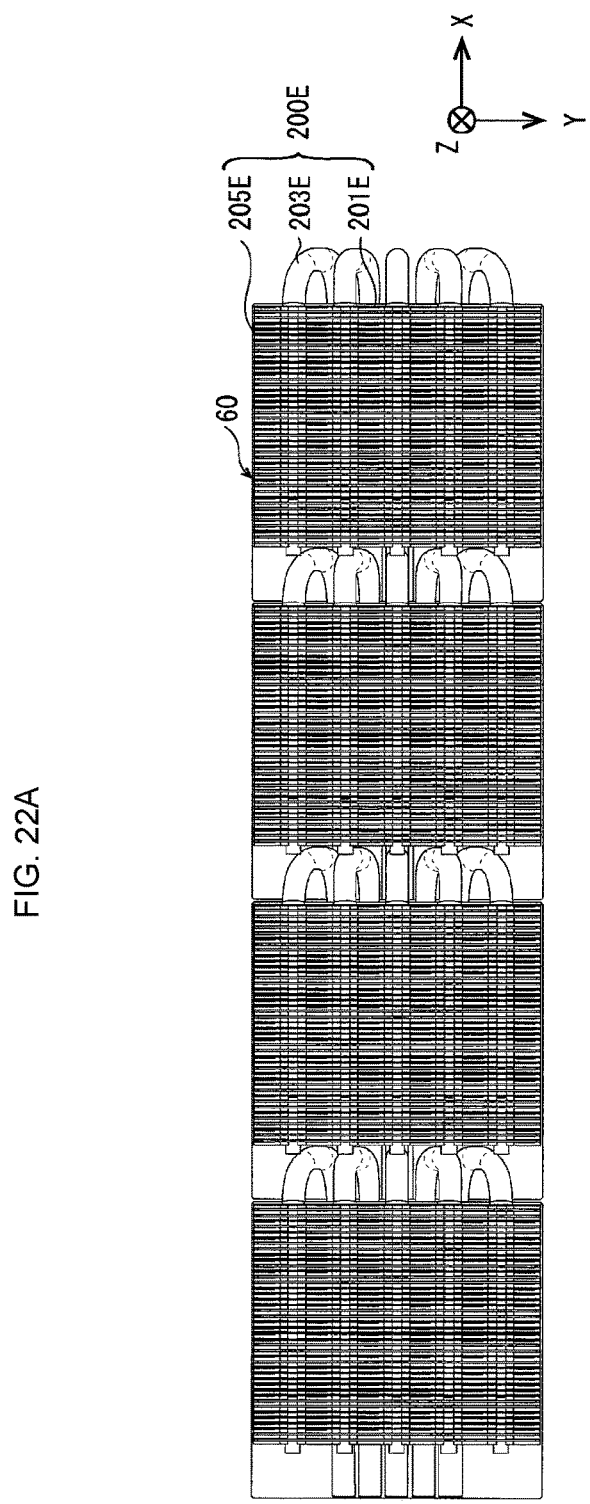
FIGS. 22A, 22B and 22C are diagrams showing that heat radiating apparatuses according to a sixth embodiment of the present disclosure are connected.
Figure 22B:
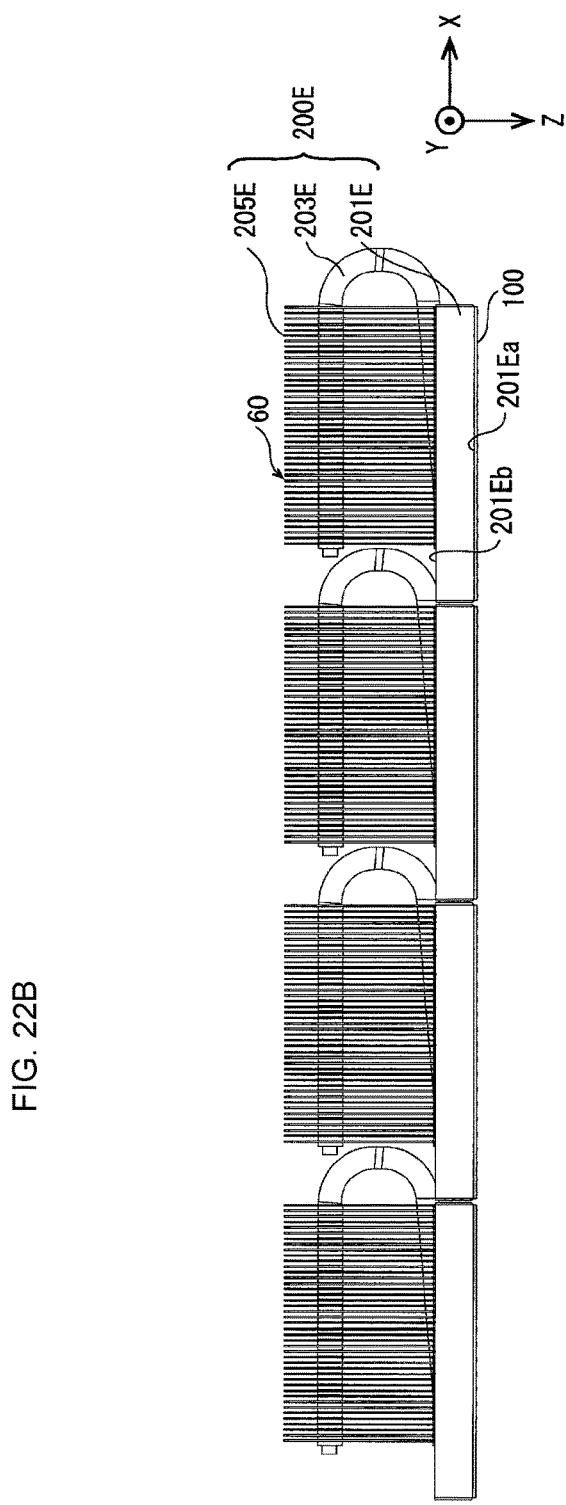
Figure 22C:
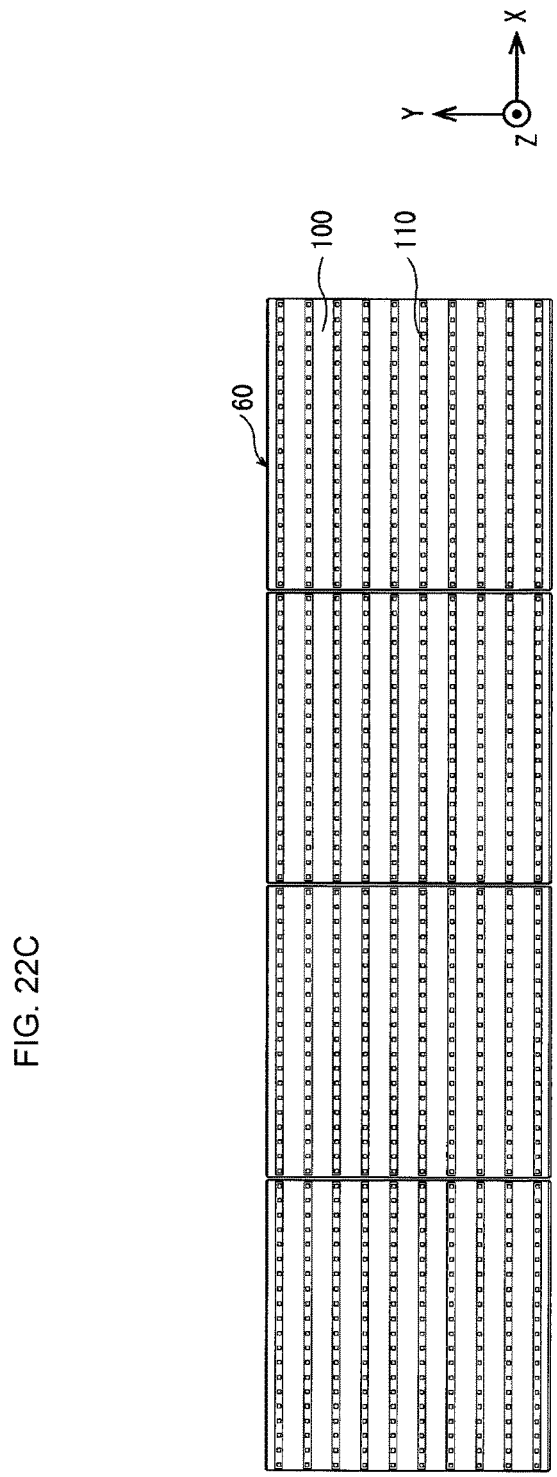

FIG. 21 is a diagram of outward appearance schematically illustrating the construction of a light illuminating apparatus 60 with a heat radiating apparatus 200E according to a sixth embodiment of the present disclosure. FIG. 21A is a plane view (a diagram when viewed from the Y-axis direction downstream side (positive direction side)) of the light illuminating apparatus 60 of this embodiment, FIG. 21B is a bottom view (a diagram when viewed from the Z-axis direction upstream side (negative direction side)), FIG. 21C is a right side view (a diagram when viewed from the X-axis direction downstream side (positive direction side)), and FIG. 21D is a left side view (a diagram when viewed from the X-axis direction upstream side (negative direction side)). As shown in FIG. 21, the light illuminating apparatus 60 of this embodiment is different from the heat radiating apparatus 200D of the fifth embodiment in the respect that an arrangement interval of first line parts 203Ea of heat pipes 203E is narrower than an arrangement interval of second line parts 203Eb. That is, in the heat radiating apparatus 200E of this embodiment, the first line parts 203Ea of each heat pipe 203E are arranged approximately parallel to Y-axis direction adjacent to the center part of the support member 201E when viewed in X-axis direction, and the second line parts 203Eb of each heat pipe 203E are arranged approximately parallel to Y-axis direction at a wider interval than the interval of the first line parts 203Ea when viewed in X-axis direction. By this construction, the cooling capacity at the center part of the support member 201E can be increased, and thus, it is effective, for example, in the case that the LED devices 110 shown in FIG. 1A are intensively arranged at the rough center part of Y-axis direction of the substrate 105. Furthermore, because the light illuminating apparatus 60 of this embodiment has the receiving part S for receiving a connecting part 203Ec of the heat pipe 203E of adjacent light illuminating apparatus 60 in the same way as the light illuminating apparatus 50 of the fifth embodiment, it is possible to enable connection and arrangement by joining the support members 201E such that first principal surfaces 201Ea of the support members 201E are successive as shown in FIG. 22.

(Variation 6)

Figure 23:
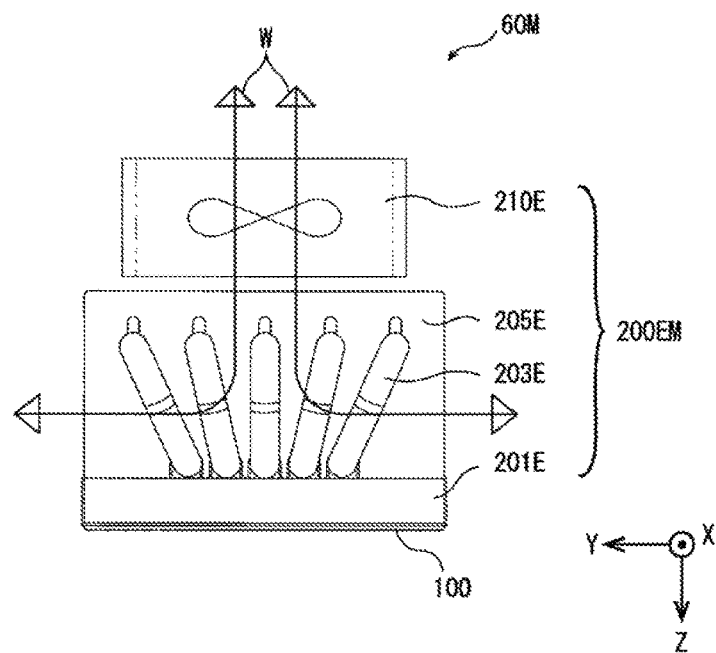
FIG. 23 is a diagram showing the construction of a variation of a heat radiating apparatus according to a sixth embodiment of the present disclosure.

FIG. 23 is a right side view (a diagram when viewed from the X-axis direction downstream side (positive direction side)) of a light illuminating apparatus 60M with a heat radiating apparatus 200EM according to a variation of the heat radiating apparatus 200E of this embodiment. As shown in FIG. 23, the light illuminating apparatus 60M of this variation is different from the light illuminating apparatus 60 of this embodiment in the respect that the heat radiating apparatus 200EM has a cooling fan 210E.

The cooling fan 210E is a device that is placed at the Z-axis direction upstream side (negative direction side) of the heat radiating apparatus 200EM to supply cooling air to the heat radiating apparatus 200EM in the same way as the cooling fan 210D of variation 5. The air current W generated by the cooling fan 210E flows between each heat radiating fin 205E to cool each heat radiating fin 205E, as well as the second line parts 203Eb of each heat pipe 203E that are inserted into and pass through each heat radiating fin 205E (FIG. 21A), and a second principal surface 201Eb of the support member 201E. Accordingly, by the construction of this variation, the cooling capacity of the heat radiating apparatus 200EM can be remarkably improved. Furthermore, the cooling fan 210E can be applied to the construction in which the light illuminating apparatuses 60 are connected as shown in FIG. 22, and in this case, one cooling fan 210E may be installed for each heat radiating apparatus 200E, and one cooling fan 210E may be installed for the plurality of heat radiating apparatuses 200E.

(Seventh Embodiment)

Figure 24A:
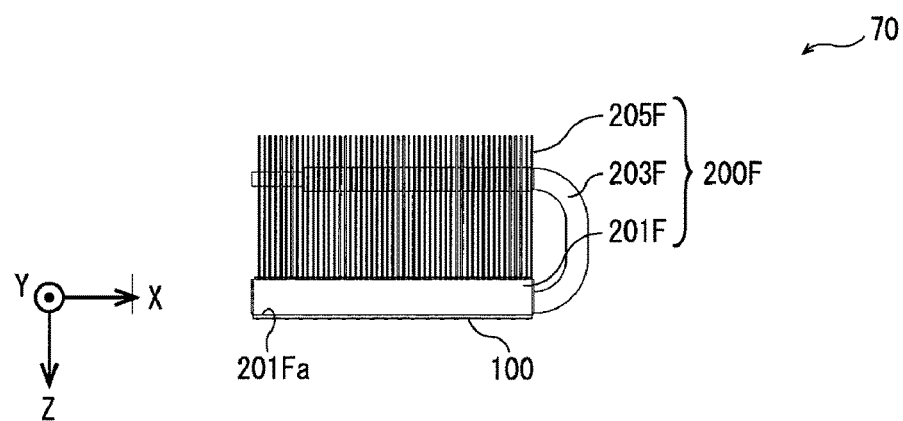
FIGS. 24A, 24B and 24C are diagrams of outward appearance schematically illustrating the construction of a light illuminating apparatus with a heat radiating apparatus according to a seventh embodiment of the present disclosure.
Figure 24B:
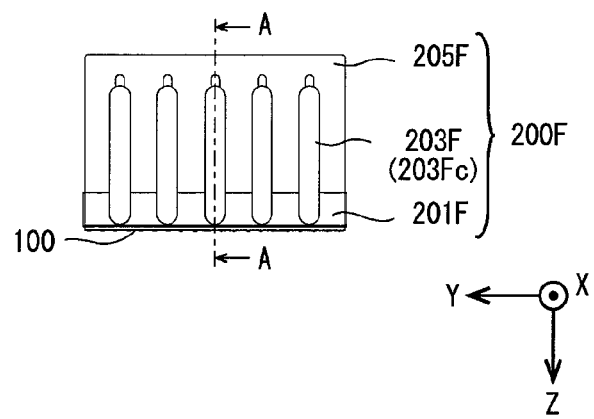
Figure 24C:
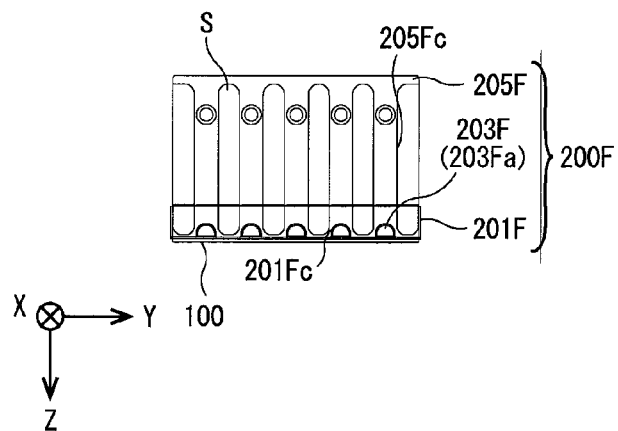
Figure 25:
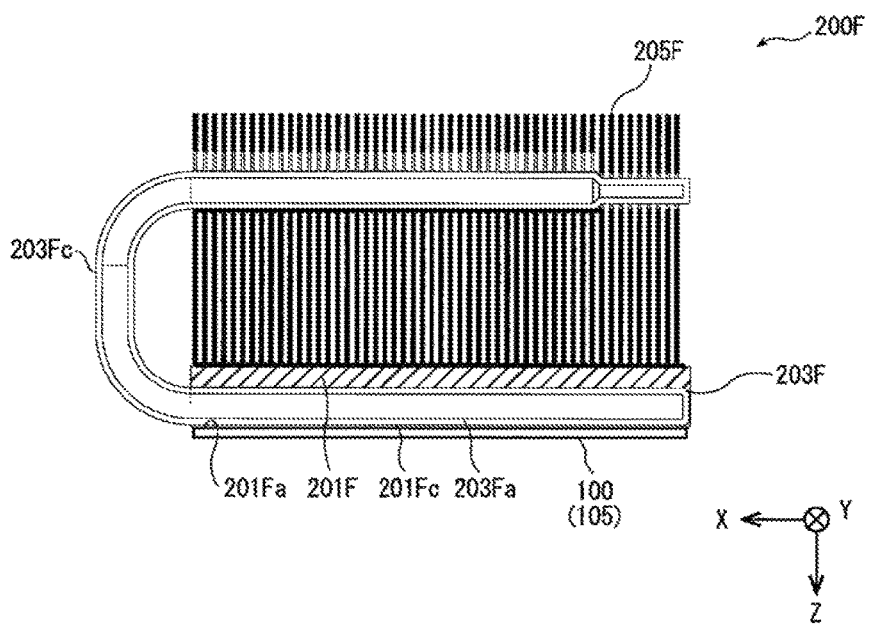
FIG. 25 is a cross sectional view illustrating the construction of a heat radiating apparatus according to a seventh embodiment of the present disclosure.

FIG. 24 is a diagram of outward appearance schematically illustrating the construction of a light illuminating apparatus 70 with a heat radiating apparatus 200F according to a seventh embodiment of the present disclosure. FIG. 24A is a plane view (a diagram when viewed from the Y-axis direction downstream side (positive direction side)) of the light illuminating apparatus 70 of this embodiment, FIG. 24B is a right side view (a diagram when viewed from the X-axis direction downstream side (positive direction side)), and FIG. 24C is a left side view (a diagram when viewed from the X-axis direction upstream side (negative direction side)). Furthermore, FIG. 25 is a cross sectional view taken along the line A-A in FIG. 24B. FIGS. 24C and 25, the light illuminating apparatus 70 of this embodiment is different from the heat radiating apparatus 200 of the first embodiment in the respect that a groove part 201Fc that fits a first line part 203Fa of a heat pipe 203F is formed on a first principal surface 201Fa side of a support member 201F, and the cross section of the first line part 203Fa of the heat pipe 203F has an approximately circular shape. That is, this embodiment is configured such that the substrate 105 of the LED unit 100 is in close contact with the first principal surface 201Fa of the support member 201F as well as the first line parts 203Fa of each heat pipe 203F. Accordingly, in this embodiment, thermal resistance between the LED unit 100 and each heat pipe 203F is greatly reduced as compared to the first embodiment, and thus, the cooling capacity is remarkably improved. For this reason, it is effective especially in the case that many LED devices 110 (FIG. 1) are placed on the substrate 105. Furthermore, in the same way as the light illuminating apparatus 10 of the first embodiment, for the light illuminating apparatus 70 of this embodiment to allow for connection and arrangement by joining the support members 201F such that the first principal surfaces 201Fa of the support members 201F are successive, 10 heat radiating fins 205F disposed at the X-axis direction upstream side (negative direction side) have cutouts 205Fc extending in Z-axis direction to form receiving parts S for receiving connecting parts 203Fc of the heat pipes 203F of adjacent light illuminating apparatus 70. Furthermore, the construction of this embodiment can be applied to the second to sixth embodiments and the first to sixth variations.

Furthermore, it should be understood that the disclosed experiments are illustrative in all aspects and are not limitative. The scope of the present disclosure is defined by the appended claims rather than the foregoing description, and encompasses all changes within the meaning and scope of equivalents to the claims.

The invention claimed is:

1. A heat radiating apparatus that is placed in close contact with a heat source to radiate heat of the heat source in air, the heat radiating apparatus comprising:
   a support member which has a shape of a plate, and is placed in close contact with the heat source on a first principal surface side;
   a heat pipe which is supported by the support member, and is thermally joined with the support member to transfer the heat from the heat source; and
   a plurality of heat radiating fins which is placed in a space that faces a second principal surface opposite to the first principal surface, and is thermally joined with the heat pipe to radiate the heat transferred by the heat pipe,
   wherein the heat pipe comprises:
     a first line part which is thermally joined with the support member;
     a second line part which is thermally joined with the plurality of heat radiating fins; and
     a plurality of connecting parts which each connect one end part of a respective first line part to one end part of a respective second line part such that the first line part and the second line part are successive, and protrudes from the support member in a direction in which the first line part extends,
   the heat radiating apparatus includes a plurality of receiving parts, such that the heat radiating apparatus is connectable to an adjacent heat radiating apparatus to comprise a plurality of heat radiating apparatuses such that the first principal surfaces of the plurality of heat radiating apparatuses are successive, and
   when the plurality of heat radiating apparatuses are connected in the direction in which the first line part extends, the receiving parts of the heat radiating apparatus receive the connecting parts of the adjacent heat radiating apparatus in a space that faces the second principal surface.

2. The heat radiating apparatus according to claim 1, wherein the heat pipe is provided in multiple numbers, and the first line parts of the plurality of heat pipes are placed at a first predetermined interval in a direction approximately orthogonal to the direction in which the first line parts extend.

3. The heat radiating apparatus according to claim 2, wherein the second line parts of the plurality of heat pipes are approximately parallel to the second principal surface, and are placed at the first predetermined interval in the direction approximately orthogonal to the direction in which the first line parts extend.

4. The heat radiating apparatus according to claim 2, wherein locations of the second line parts of each heat pipe differ in a direction approximately perpendicular to and a direction approximately parallel to the second principal surface, when viewed in the direction in which the first line parts extend.

5. The heat radiating apparatus according to claim 4, wherein comprises a fan which is placed in the space that faces the second principal surface to generate an air current in a direction approximately parallel to the second principal surface.

6. The heat radiating apparatus according to claim 2, wherein the first line part is inclined with respect to the second principal surface,
the connecting part protrudes in a direction facing away from the second principal surface, and
the receiving part is formed on a side opposite to the side from which the connecting part protrudes.

7. The heat radiating apparatus according to claim 6, wherein the second line parts of the plurality of heat pipes are arranged at a second preset interval that is longer than the first preset interval in the direction approximately orthogonal to the direction in which the first line parts extend.

8. The heat radiating apparatus according to claim 1, wherein the receiving part is formed between each heat pipe on a side opposite to a side from which the connecting part protrudes.

9. The heat radiating apparatus according to claim 1, wherein each receiving part is formed between each heat pipe on a same side as a side from which the connecting part protrudes.

10. The heat radiating apparatus according to claim 1, wherein comprises a fan which is placed in the space that faces the second principal surface to generate an air current in a direction approximately perpendicular to the second principal surface.

11. The heat radiating apparatus according to claim 1, wherein the support member has at least one set of approximately parallel sides, and
the first line part extends along the sides of the support member.

12. The heat radiating apparatus according to claim 1, wherein the support member has at least one set of approximately parallel sides, and
the first line part extends at a preset angle of inclination with respect to the sides of the support member.

13. The heat radiating apparatus according to claim 12, wherein each receiving part is formed on a side opposite to a side from which the connecting part protrudes.

14. The heat radiating apparatus according to claim 12, wherein comprises a fan which is placed in the space that faces the second principal surface to generate an air current in a direction approximately perpendicular to the second principal surface.

15. The heat radiating apparatus according to claim 1, wherein the second line part is approximately parallel to the second principal surface.

16. The heat radiating apparatus according to claim 1, wherein the support member has a groove part of a shape conforming to the first line part on the second principal surface side, and
the first line part is placed to be inserted into the groove part.

17. The heat radiating apparatus according to claim 1, wherein the support member has a groove part of a shape conforming to the first line part on the first principal surface side, and
the first line part is placed to be inserted into the groove part.

18. A light illuminating apparatus comprising:
the heat radiating apparatus defined in claim 1;
a substrate placed in close contact with the first principal surface; and
a plurality of light emitting diode (LED) devices placed approximately parallel to the first line part of the heat pipe on a surface of the substrate.

19. The light illuminating apparatus according to claim 18, wherein the plurality of LED devices is placed at a predetermined pitch in a direction in which the first line part extends, and
a distance from the other end of the first line part to one end of the support member in the direction in which the first line part extends is ½ or less of the pitch.

20. The light illuminating apparatus according to claim 18, wherein the plurality of LED devices is placed in multiple rows in a direction approximately orthogonal to the direction in which the first line part extends.

21. The light illuminating apparatus according to claim 18, wherein the plurality of LED devices is placed at a location opposite to the first line part with the substrate interposed between.

22. The light illuminating apparatus according to claim 18, wherein the light illuminating apparatus comprises the plurality of heat radiating apparatuses connected such that the first principal surfaces are successive.

23. The light illuminating apparatus according to claim 22, wherein the plurality of heat radiating apparatuses is arranged and connected in the direction in which the first line part extends.

24. The light illuminating apparatus according to claim 18, wherein the LED device emits light of a wavelength that acts on an ultraviolet curable resin.

* * * * *